US012782431B2

(12) United States Patent
Machida et al.

(10) Patent No.: US 12,782,431 B2
(45) Date of Patent: Nov. 3, 2026

(54) INSPECTION METHOD AND METHOD OF MANUFACTURING IMAGING ELEMENT

(71) Applicant: Panasonic Intellectual Property Management Co., Ltd., Osaka (JP)

(72) Inventors: Shinichi Machida, Osaka (JP); Sanshiro Shishido, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 133 days.

(21) Appl. No.: 19/001,675

(22) Filed: Dec. 26, 2024

(65) Prior Publication Data

US 2025/0130277 A1 Apr. 24, 2025

Related U.S. Application Data

(63) Continuation of application No. PCT/JP2023/016527, filed on Apr. 26, 2023.

(30) Foreign Application Priority Data

Jul. 20, 2022 (JP) ................................ 2022-115715

(51) Int. Cl.
*G01R 31/28* (2006.01)
*G01R 31/02* (2006.01)
(Continued)

(52) U.S. Cl.
CPC ..... *G01R 31/2889* (2013.01); *G01R 31/2879* (2013.01); *H10P 74/207* (2026.01)

(58) Field of Classification Search
CPC ........ G01R 31/02; G01R 31/26; G01R 31/28; H01L 21/66; H01L 27/14; H01L 27/146
See application file for complete search history.

(56) References Cited

U.S. PATENT DOCUMENTS

2013/0009044 A1 1/2013 Inomata
2015/0048352 A1 2/2015 Ichiki
(Continued)

FOREIGN PATENT DOCUMENTS

| | | |
|---|---|---|
| JP | 2011-216853 | 10/2011 |
| JP | 2013-211291 | 10/2013 |
| WO | 2020/225987 | 11/2020 |

OTHER PUBLICATIONS

International Search Report of PCT application No. PCT/JP2023/016527 dated Jul. 25, 2023.

*Primary Examiner* — Neel D Shah
(74) *Attorney, Agent, or Firm* — Rimon P.C.

(57) ABSTRACT

An inspection method includes: preparing a device that includes a plurality of pixel electrodes, a counter electrode disposed to face the plurality of pixel electrodes, a photoelectric conversion layer disposed between the plurality of pixel electrodes and the counter electrode, a test electrode disposed to face the counter electrode with the photoelectric conversion layer interposed between the counter electrode and the test electrode, a first electrode pad electrically connected to the counter electrode and exposed to an outside of the device, and a second electrode pad electrically connected to the test electrode and exposed to the outside of the device, the test electrode being disposed between two adjacent pixel electrodes of the plurality of pixel electrodes; and measuring a current that flows between the first electrode pad and the second electrode pad by applying a voltage between the first electrode pad and the second electrode pad.

12 Claims, 12 Drawing Sheets

(51) Int. Cl.

| | |
|---|---|
| ***G01R 31/26*** | (2020.01) |
| ***H01L 21/66*** | (2006.01) |
| ***H01L 27/14*** | (2006.01) |
| ***H10P 74/20*** | (2026.01) |

(56) References Cited

U.S. PATENT DOCUMENTS

2021/0375998 A1 12/2021 Shishido et al.
2021/0409634 A1* 12/2021 Sato .................... H04N 25/134

* cited by examiner

INSPECTION METHOD AND METHOD OF MANUFACTURING IMAGING ELEMENT

BACKGROUND

1. Technical Field

The present disclosure relates to an inspection method and a method of manufacturing an imaging element.

2. Description of the Related Art

In recent years, there have been known imaging elements in which a photoelectric conversion layer is stacked above a complementary metal oxide semiconductor (CMOS) reading circuit. In such imaging elements, the quality of the photoelectric conversion layer affects the characteristics of the imaging element. In a process of manufacturing imaging elements, it is important to inspect the quality of the photoelectric conversion layer, in order to be able to avoid assembly and processing of a defective product in a process after the inspection.

Japanese Patent No. 4783868 discloses a method of inspecting a photoelectric conversion layer using a test photoelectric converter disposed outside a photoelectric converter.

Japanese Patent No. 5806635 discloses a method of inspecting a photoelectric conversion layer using a test pattern formed outside an imaging region.

SUMMARY

In one general aspect, the techniques disclosed here feature an inspection method including: preparing a device that includes a plurality of pixel electrodes, a counter electrode disposed to face the plurality of pixel electrodes, a photoelectric conversion layer disposed between the plurality of pixel electrodes and the counter electrode, a test electrode disposed to face the counter electrode with the photoelectric conversion layer interposed between the counter electrode and the test electrode, a first electrode pad electrically connected to the counter electrode and exposed to an outside of the device, and a second electrode pad electrically connected to the test electrode and exposed to the outside of the device, the test electrode being disposed between two adjacent pixel electrodes of the plurality of pixel electrodes; and measuring a current that flows between the first electrode pad and the second electrode pad by applying a voltage between the first electrode pad and the second electrode pad.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Circumstances Leading to One Aspect of the Present Disclosure

In an imaging element in which a photoelectric conversion layer is stacked above a complementary metal oxide semiconductor (CMOS) reading circuit, current-voltage characteristics affected by the quality of the photoelectric conversion layer affect the characteristics of the imaging element. For example, if there is a deficiency in the photoelectric conversion layer, a current tends to flow through the photoelectric conversion layer even in a state in which the photoelectric conversion layer is not irradiated with light, increasing a dark current. Therefore, it is important to detect the quality of the photoelectric conversion layer in a manufacturing process, in order to be able to avoid assembly and processing of a defective product in a process after the inspection.

In order to measure a current that flows through the photoelectric conversion layer, it is necessary to measure the current by controlling the state of radiation of light to the photoelectric conversion layer while applying a bias voltage to electrodes connected to the photoelectric conversion layer. When a new test structure is mounted, however, there is an issue that the yield of imaging elements is reduced and the performance of the imaging elements is reduced.

Figure 1:
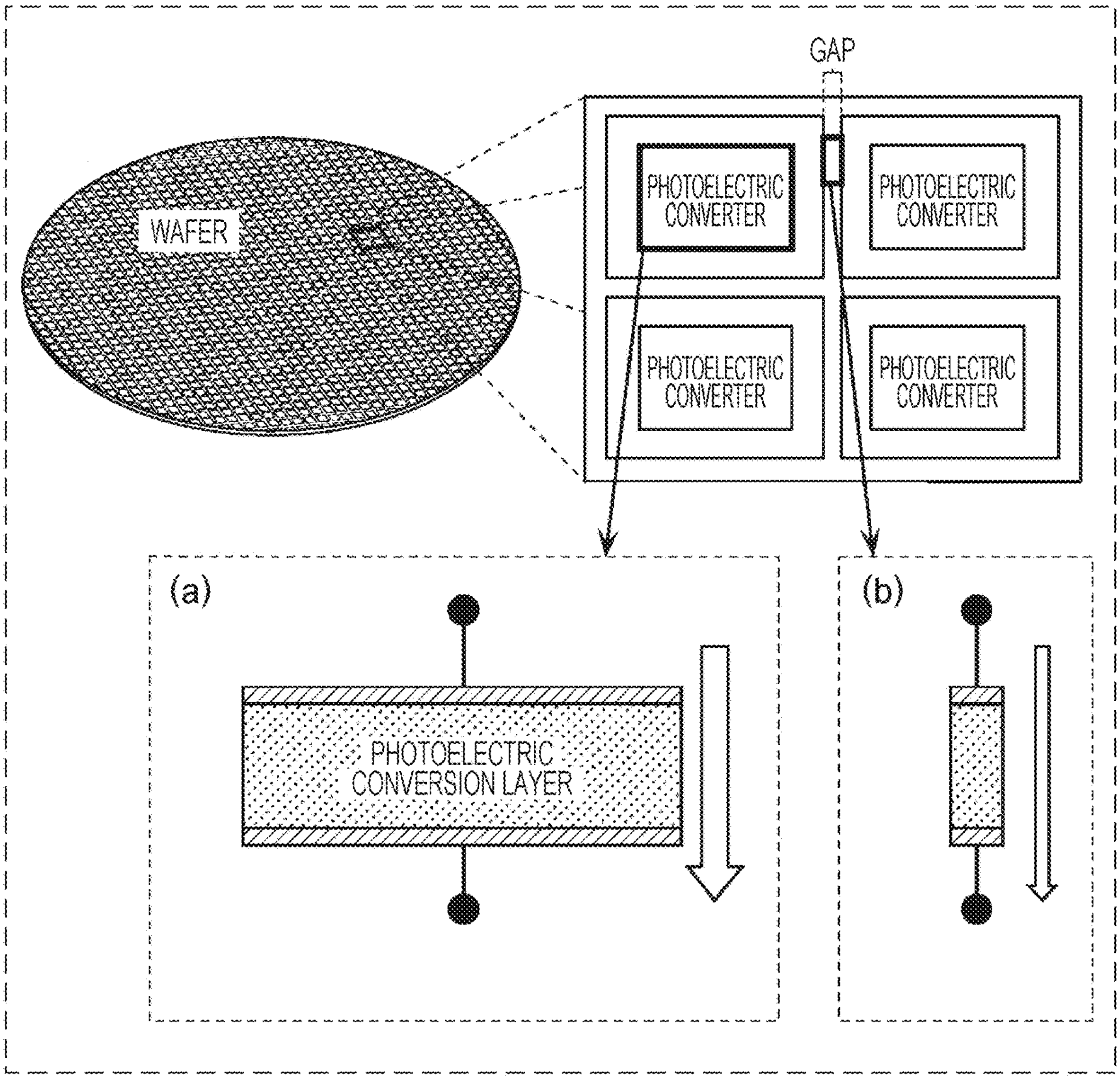
FIG. 1 illustrates the arrangement of an inspection structure in a wafer.

FIG. 1 illustrates the arrangement of an inspection structure in a wafer.

In the related art, in a process of manufacturing an imaging element, a test structure for process control monitor (PCM) that is used to check the quality of a photoelectric conversion layer is often disposed in a minute area such as a scribe area provided between a chip and a chip in a wafer, indicated as a "gap" in FIG. 1, or an end portion of a chip.

In an inspection that uses such a minute area, however, there is an issue that the area of a photoelectric conversion layer is so small to measure a dark current and a photoelectric current generated in the photoelectric conversion layer, as illustrated in Portion (b) of FIG. 1, that the currents are too low for the inspection accuracy to be high. In particular, the dark current is minute compared to the photoelectric current, and therefore is difficult to measure.

Since the dark current and the photoelectric current generated in the photoelectric conversion layer increase roughly in proportion to the area of the photoelectric conversion layer, the inspection accuracy can be enhanced by increasing the area of the photoelectric conversion layer to be inspected. If the area of a test structure solely for inspection is increased, on the other hand, the yield of imaging elements is reduced, incurring an increase in unit price of chips. The test structure disposed on the scribe area is broken during chip dicing, and there is also an issue that the dicing saw is soiled with a material used in the photoelectric conversion layer if a test structure including the photoelectric conversion layer is provided in the scribe area.

The present inventors have focused on measuring a current that flows through a photoelectric conversion layer using a photoelectric converter to be used in actual imaging, as illustrated in Portion (a) of FIG. 1. The present inventors have found that this makes it possible to increase the amount of a current to be measured by increasing the area of the photoelectric conversion layer for inspection, without reducing the yield of imaging elements by forming a test structure, leading to one aspect of the present disclosure. One aspect of the present disclosure will be described in detail below.

Overview of the Present Disclosure

An overview of one aspect of the present disclosure is as follows.

One aspect of the present disclosure provides an inspection method including: preparing a device that includes a plurality of pixel electrodes, a counter electrode disposed to face the plurality of pixel electrodes, a photoelectric conversion layer disposed between the plurality of pixel electrodes and the counter electrode, a test electrode disposed to face the counter electrode with the photoelectric conversion layer interposed between the counter electrode and the test electrode, a first electrode pad electrically connected to the counter electrode and exposed to an outside of the device, and a second electrode pad electrically connected to the test electrode and exposed to the outside of the device, the test electrode being disposed between two adjacent pixel electrodes of the plurality of pixel electrodes; and measuring a current that flows between the first electrode pad and the second electrode pad by applying a voltage between the first electrode pad and the second electrode pad.

Consequently, a current that flows through the photoelectric conversion layer between the test electrode disposed between the plurality of pixel electrodes and the counter electrode can be measured using the first electrode pad and the second electrode pad. Therefore, since a current through the photoelectric conversion layer can be measured by effectively using a region in which the plurality of pixel electrodes are formed, the chip size is not increased compared to the case where a test structure is separately formed, suppressing a reduction in the yield of imaging elements. Since a current can be caused to flow through the photoelectric conversion layer using the test electrode disposed between the plurality of pixel electrodes, the area of the photoelectric conversion layer to be inspected can be ensured easily. Hence, the inspection accuracy can be enhanced by increasing the amount of the current that flows through the photoelectric conversion layer.

The device may further include a charge accumulator that accumulates charges obtained by the photoelectric conversion layer, the plurality of pixel electrodes may be electrically connected to the charge accumulator, and the test electrode may not be electrically connected to the charge accumulator, for example.

The test electrode may have a same potential over a region in which the plurality of pixel electrodes are disposed, for example.

Consequently, the test electrode may be connected in the region in which the plurality of pixel electrodes are disposed, and therefore the region in which the test electrode is formed can be further reduced, further suppressing a reduction in the yield of imaging elements.

The photoelectric conversion layer may convert light incident on the photoelectric conversion layer into charges, the plurality of pixel electrodes may collect the charges, and the test electrode may function as a shield that suppresses movement of the charges between the plurality of pixel electrodes when the plurality of pixel electrodes collect the charges, for example.

Consequently, the test electrode can be used as a shield electrode.

The test electrode may surround each of the plurality of pixel electrodes, for example.

Consequently, a current that flows through the photoelectric conversion layer around the pixel electrodes can be efficiently collected and measured with high sensitivity.

The test electrode may be disposed in a mesh shape in a region in which the plurality of pixel electrodes are disposed, for example.

Consequently, a current that flows through the entire photoelectric conversion layer in the region in which the plurality of pixel electrodes are disposed can be measured.

The inspection method may further include determining whether or not the photoelectric conversion layer is good on a basis of the current, for example.

Consequently, it can be determined whether or not the photoelectric conversion layer is good on the basis of the current that flows through the photoelectric conversion layer. The occurrence of a defective product and an increase in cost due to the manufacture of a defective product can be avoided by determining whether or not to continue the subsequent manufacturing process using the determination result, for example.

The measuring of the current may include applying a predetermined voltage between the first electrode pad and the second electrode pad, and the determining of whether or not the photoelectric conversion layer is good may include determining that the photoelectric conversion layer is not good when a value of the current that flows between the first electrode pad and the second electrode pad when the predetermined voltage is applied is equal to or more than a predetermined current value, and determining that the photoelectric conversion layer is good when the current value is less than the predetermined current value, for example.

Consequently, a deficiency that occurs when a current tends to flow through the photoelectric conversion layer, such as when there is a defect in the photoelectric conversion layer, can be determined easily.

The measuring of the current may include measuring current-voltage characteristics between the first electrode pad and the second electrode pad while sweeping the voltage applied between the first electrode pad and the second electrode pad, and the determining of whether or not the photoelectric conversion layer is good may include determining whether or not the photoelectric conversion layer is good on a basis of the measured current-voltage characteristics, for example.

Consequently, currents corresponding to a plurality of voltages are measured, further enhancing the inspection accuracy.

The determining of whether or not the photoelectric conversion layer is good may include determining whether or not the photoelectric conversion layer is good on a basis of a slope of the measured current-voltage characteristics, for example.

Consequently, it is possible to expect that variations in current value for variations in voltage, etc., will be detected with high sensitivity, enhancing the inspection accuracy.

One aspect of the present disclosure provides a method of manufacturing an imaging element, including: fabricating a device that includes a plurality of pixel electrodes, a counter electrode disposed to face the plurality of pixel electrodes, a photoelectric conversion layer disposed between the plurality of pixel electrodes and the counter electrode, a test electrode disposed to face the counter electrode with the photoelectric conversion layer interposed between the counter electrode and the test electrode, a first electrode pad electrically connected to the counter electrode and exposed to an outside of the device, and a second electrode pad electrically connected to the test electrode and exposed to the outside of the device, the test electrode being disposed between two adjacent pixel electrodes of the plurality of pixel electrodes; performing an inspection on the device by the above inspection method; continuing forming an imaging element on the device when the photoelectric conversion layer is determined to be good in the inspection; and discontinuing forming the imaging element when the photoelectric conversion layer is not determined to be good in the inspection.

Consequently, imaging elements can be manufactured by evaluating the quality of the photoelectric conversion layer using the inspection method described above in a process of manufacturing imaging elements. Imaging elements that include a photoelectric conversion layer determined as being good can be manufactured, suppressing the occurrence of a defective product.

One aspect of the present disclosure provides an imaging apparatus including: a plurality of pixel electrodes; a counter electrode disposed to face the plurality of pixel electrodes; a photoelectric conversion layer disposed between the plurality of pixel electrodes and the counter electrode; a test electrode disposed to face the counter electrode with the photoelectric conversion layer interposed between the counter electrode and the test electrode, the test electrode being disposed between two adjacent pixel electrodes of the plurality of pixel electrodes; a first electrode pad electrically connected to the counter electrode; and a second electrode pad electrically connected to the test electrode.

Embodiments will be described below with reference to the drawings.

The embodiments to be described below indicate comprehensive or specific examples. The numerical values, shapes, constituent elements, arrangement positions and connection modes of the constituent elements, processes (steps), order of the processes (steps), etc. are exemplary, and are not intended to limit the present disclosure. Of the constituent elements in the following present embodiment, constituent elements not set forth in the independent claims are described as optional constituent elements. The drawings are schematic drawings, and are not necessarily drawn strictly to scale. Thus, the scales of the drawings do not necessarily coincide with each other, for example. In the drawings, substantially the same components are occasionally given the same reference numerals to omit or simplify redundant description.

Herein, terms that describe the relationship between elements, terms that describe the shape of elements, and numerical ranges do not only express their strict meaning, but also mean substantially equivalent ranges that allow a difference of about a few percent, for example.

The terms "above" and "below" as used herein do not refer to an upper direction (vertically above) and a lower direction (vertically below) in absolute space recognition, but are used as terms prescribed by the relative positional relationship based on the stacking order in the stacking configuration. Specifically, the light receiving side of an imaging element is defined as "above", and the side opposite to the light receiving side is defined as "below". The terms "above" and "below" are merely used to indicate the arrangement of members relative to each other, and are not intended to limit the posture of an imaging element during use. The terms "above" and "below" are applied not only when two constituent elements are spaced apart from each other with another constituent element interposed between the two constituent elements, but also when two constituent elements are disposed in close contact with each other.

EMBODIMENT

A wafer, an inspection method, an imaging element, and a method of manufacturing an imaging element according to an embodiment will be described below.

Configuration of Wafer

Figure 2:
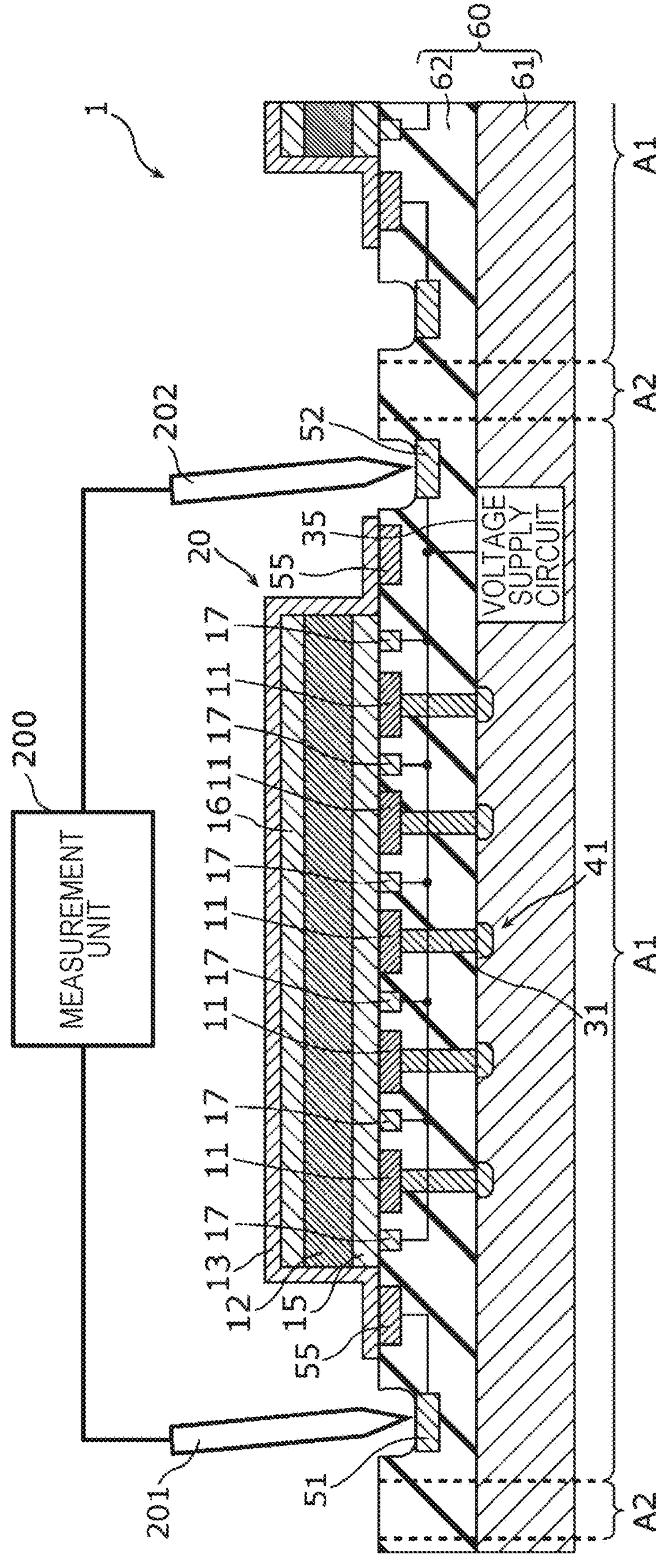
FIG. 2 is a sectional view illustrating a wafer according to an embodiment.

First, the overall configuration of a wafer 1 according to the present embodiment will be described. FIG. 2 is a sectional view illustrating the wafer 1 according to the present embodiment. In FIG. 2, a section of a portion of the wafer 1 is illustrated.

As illustrated in FIG. 2, the wafer 1 includes a CMOS circuit layer 60, a plurality of pixel electrodes 11, a shield electrode 17, an electrode pad 51, an electrode pad 52, an extraction electrode 55, a photoelectric conversion layer 12, a counter electrode 13, an electron blocking layer 15, and a hole blocking layer 16. The wafer 1 is an example of a device, and is a wafer in which a plurality of imaging elements are to be formed. The wafer 1 includes a plurality of imaging element areas A1 each corresponding to a single imaging element, and a scribe area A2 as a region to be removed when the wafer is cut into individual pieces of imaging elements. The same imaging element configuration is formed in the plurality of imaging element areas A1. The plurality of pixel electrodes 11, the shield electrode 17, the electrode pad 51, the electrode pad 52, the extraction electrode 55, the photoelectric conversion layer 12, the counter electrode 13, the electron blocking layer 15, and the hole blocking layer 16 are formed in the imaging element areas A1, and are not formed in the scribe area A2.

The CMOS circuit layer 60 includes a semiconductor substrate 61 and an interlayer insulating layer 62 disposed on the semiconductor substrate 61. A read out integrated circuit (ROIC) is formed in the CMOS circuit layer 60, although not illustrated in detail in FIG. 2. The CMOS circuit layer 60 is provided with charge accumulators 41 and plugs 31 that connect the charge accumulators 41 and the pixel electrodes 11. The CMOS circuit layer 60 is fabricated by back end of line (BEOL; wiring process) and front end of line (FEOL; substrate process), for example.

The semiconductor substrate 61 is a substrate constituted of silicon such as a p-type silicon substrate, for example. The semiconductor substrate 61 is not limited to a substrate that is entirely semiconductor. The interlayer insulating layer 62 is formed from an insulating material such as silicon dioxide, for example.

The plurality of pixel electrodes 11, the photoelectric conversion layer 12, the counter electrode 13, the electron blocking layer 15, and the hole blocking layer 16 constitute the photoelectric converter 20 above the CMOS circuit layer 60. The shield electrode 17 is disposed between the photoelectric converter 20 and the CMOS circuit layer 60. The photoelectric converter 20 is provided in each of the plurality of imaging element areas A1.

The plurality of pixel electrodes 11 are film-shaped electrodes formed on the interlayer insulating layer 62. The pixel electrodes 11 collect signal charges generated by the photoelectric conversion layer 12. The pixel electrodes 11 are electrically connected to the charge accumulators 41 the plugs 31. The signal charges collected by the pixel electrodes 11 are accumulated in the charge accumulators 41. The charge accumulators 41 include a so-called floating diffusion (FD).

The pixel electrodes 11 are formed using a conductive material. The conductive material may be aluminum, metal such as copper, a metal nitride, or a polysilicon doped with impurities to be rendered conductive.

The photoelectric conversion layer 12 is located between the pixel electrodes 11 and the counter electrode 13. The photoelectric conversion layer 12 is also located between the shield electrode 17 and the counter electrode 13. The photoelectric conversion layer 12 receives incident light to generate an electron-hole pair as a carrier.

Organic semiconductor materials, semiconductor quantum dots, semiconductor carbon nano tubes, compound semiconductors such as InGaAs (indium gallium arsenic), etc., are used as photoelectric conversion materials that constitute the photoelectric conversion layer 12, for example. The photoelectric conversion materials may include a combination of two or more of organic semiconductor materials, semiconductor quantum dots, semiconductor carbon nano tubes, and compound semiconductors, and may contain a plurality of types of organic semiconductor materials, etc.

The photoelectric conversion layer 12 may absorb, that is, be sensitive to, light in the wavelength range of infrared light. In order to absorb light in the wavelength range of infrared light, the band gap of the photoelectric conversion materials is narrowed, and therefore the photoelectric conversion materials tend to generate a dark current through thermal excitation compared to photoelectric conversion materials that absorb visible light. Therefore, it is easy to determine whether or not the photoelectric conversion layer 12 is good by measuring a dark current that flows through the photoelectric conversion layer 12.

The counter electrode 13 is disposed to face the plurality of pixel electrodes 11 and the shield electrode 17 with the photoelectric conversion layer 12 interposed therebetween. The counter electrode 13 is a film-shaped transparent electrode formed from a transparent conductive material, for example. The term "transparent" as used herein means to transmit at least a part of light in the wavelength range to be detected, and it is not necessary to transmit light in the entire wavelength range of visible light and infrared light. Herein, electromagnetic waves in general, including visible light and infrared light, are expressed as "light" for convenience.

The counter electrode 13 is formed using a transparent conducting oxide (TCO) such as ITO, IZO, AZO, FTO, $SnO_2$, $TiO_2$, and ZnO, for example.

By controlling the potential of the counter electrode 13 with respect to the potential of the pixel electrodes 11, one of a hole and an electron in an electron-hole pair generated in the photoelectric conversion layer 12 through photoelectric conversion can be collected by the pixel electrodes 11 as a signal charge. Signal charges collected by the pixel electrodes 11 are accumulated in the charge accumulators 41 via the plugs 31. More specifically, a photocurrent in an amount matching the amount of light incident on the photoelectric conversion layer 12 and the sensitivity of the photoelectric conversion layer 12 flows to the pixel electrodes 11 at light times when light is incident on the photoelectric conversion layer 12, and a dark current flows to the pixel electrodes 11 at dark times when no light is incident on the photoelectric conversion layer 12. The pixel electrodes 11 collect charges due to such currents.

The signal charges accumulated in the charge accumulators 41 are read by a reading circuit connected to the charge accumulators 41. When holes are used as signal charges, for example, the holes can be selectively collected by the pixel electrodes 11 by making the potential of the counter electrode 13 higher than that of the pixel electrodes 11. A case where holes are used as signal charges will be described below. It is also possible to use electrons as signal charges. In this case, it is only necessary to make the potential of the counter electrode 13 lower than that of the pixel electrodes 11.

The electron blocking layer 15 has a function of suppressing injection of electrons from the pixel electrodes 11 into the photoelectric conversion layer 12. The electron blocking layer 15 also transports holes as signal charges generated by the photoelectric conversion layer 12 to the pixel electrodes 11. The upper surface of the electron blocking layer 15 is in contact with the photoelectric conversion layer 12. The lower surface of the electron blocking layer 15 is in contact with the pixel electrodes 11 and the shield electrode 17.

The hole blocking layer 16 has a function of suppressing injection of holes from the counter electrode 13 into the photoelectric conversion layer 12. The hole blocking layer 16 also transports electrons, as charges opposite to the signal charges generated by the photoelectric conversion layer 12, to the counter electrode 13. The upper surface of the hole blocking layer 16 is in contact with the counter electrode 13. The lower surface of the hole blocking layer 16 is in contact with the photoelectric conversion layer 12.

The respective materials of the electron blocking layer 15 and the hole blocking layer 16 are selected from known materials in consideration of the strength of bonding to an adjacent layer, the difference in ionization potential, the difference in electron affinity, etc., for example.

When electrons are used as signal charges, the wafer 1 may be configured with the electron blocking layer 15 and the hole blocking layer 16 interchanged. The wafer 1 may not include at least one of the electron blocking layer 15 and the hole blocking layer 16.

The photoelectric conversion layer 12, the electron blocking layer 15, and the hole blocking layer 16 are each formed by forming a film using an application method such as spin coat or a vacuum deposition method in which the material of the layer is evaporated by heating the material under a vacuum and deposited onto a substrate, etc., for example. The photoelectric conversion layer 12, the electron blocking layer 15, and the hole blocking layer 16 are formed on the CMOS circuit layer 60 over the entire wafer 1, and patterned into shapes of the imaging element areas A1 as illustrated in FIG. 2, for example.

The shield electrode 17 is disposed to face the counter electrode 13 with the photoelectric conversion layer 12 interposed between the counter electrode 13 and the shield electrode 17. The shield electrode 17 is formed on the interlayer insulating layer 62, and disposed between the plurality of pixel electrodes 11. The shield electrode 17 is an example of a test electrode. The shield electrode 17 overlaps the photoelectric converter 20 in a plan view.

The shield electrode 17 is supplied with a voltage from a voltage supply circuit 35 provided in the CMOS circuit layer 60. By controlling the shield electrode 17 to a predetermined potential, the shield electrode 17 functions as a shield that suppresses movement of charges between the plurality of pixel electrodes 11 when the plurality of pixel electrodes 11 collect the charges, and can be used to suppress so-called crosstalk. The voltage supply circuit 35 may not be provided in the CMOS circuit layer 60, and the shield electrode 17 may be supplied with a voltage from a voltage supply circuit 35 provided outside. The shield electrode 17 is not electrically connected to the charge accumulators 41.

Figure 3:
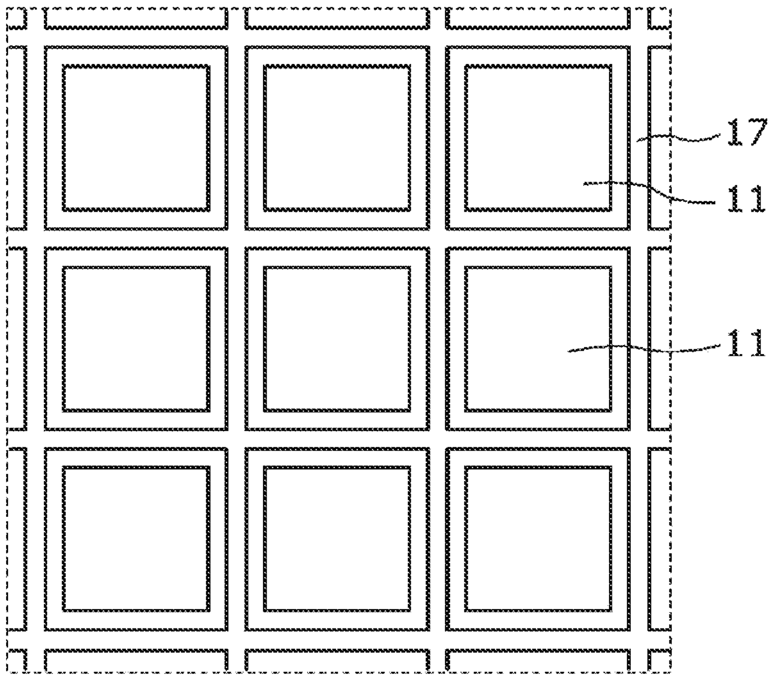
FIG. 3 is a plan view illustrating an example of the planar layout of pixel electrodes and shield electrodes according to the embodiment.

The shield electrode 17 and the pixel electrodes 11 are separated from each other via a part of the interlayer insulating layer 62. FIG. 3 is a plan view illustrating an example of the planar layout of the pixel electrodes 11 and the shield electrodes 17 according to the embodiment. In FIG. 3, components other than the pixel electrodes 11 and the shield electrode 17 are not illustrated.

As illustrated in FIG. 3, the plurality of pixel electrodes 11 are arranged in a two-dimensional array. The shield electrode 17 is disposed between adjacent pixel electrodes 11 in a plan view. The shield electrode 17 is disposed so as to interpose the plurality of pixel electrodes 11 in a plan view, for example. In the present embodiment, the shield electrode 17 surrounds each of the plurality of pixel electrodes 11. The shield electrode 17 is collectively formed in a region in which the plurality of pixel electrodes 11 are disposed, and has the same potential over the region in which the plurality of pixel electrodes 11 are disposed, for example. The region in which the plurality of pixel electrodes 11 are disposed may be rephrased as a region in which the photoelectric converter 20 discussed above is disposed in a plan view, or an imaging surface formed by a pixel array PA to be discussed later.

The shield electrode 17 is extended in a mesh shape in the region in which the plurality of pixel electrodes 11 are disposed. In other words, the shield electrode 17 is in a lattice shape in a plan view. The pixel electrodes 11 are disposed in a plurality of openings formed in the shield electrode 17. In a plan view, the area of the plurality of pixel electrodes 11 is larger than the area of the shield electrode 17. Consequently, a reduction in the sensitivity of the imaging elements can be suppressed. The planar shape of the shield electrode 17 is not specifically limited as long as the shield electrode 17 is disposed between adjacent pixel electrodes 11. For example, the shield electrode 17 may be provided as divided into two or more. When the shield electrode 17 is provided as divided into two or more, the two or more shield electrodes 17 are connected to a wire, etc., to have the same potential, for example. The two or more shield electrodes 17 may be provided with electrode pads 52 corresponding to the respective shield electrodes 17 and connected to the shield electrodes 17. In a plan view, the area of the plurality of pixel electrodes 11 may be equal to the area of the shield electrode 17, or may be less than the area of the shield electrode 17.

The shield electrode 17 is formed using a conductive material. The conductive material may be metal such as aluminum or copper, a metal nitride, or a polysilicon doped with impurities to be rendered conductive, for example.

The components around the photoelectric converter 20 will be described with reference to FIG. 2 again.

The electrode pad 51 is electrically connected to the counter electrode 13 via the extraction electrode 55 and a wire in the interlayer insulating layer 62. The electrode pad 51 is formed in the interlayer insulating layer 62, and the upper surface of the electrode pad 51 is exposed to the outside of the wafer 1 through an opening formed in the interlayer insulating layer 62. The electrode pad 51 is an example of a first electrode pad.

The electrode pad 52 is electrically connected to the shield electrode 17 via a wire in the interlayer insulating layer 62. The electrode pad 52 is formed in the interlayer insulating layer 62, and the upper surface of the electrode pad 52 is exposed to the outside of the wafer 1 through an opening formed in the interlayer insulating layer 62. The electrode pad 52 is an example of a second electrode pad.

The electrode pad 51 and the electrode pad 52 are electrodes to contact a probe terminal 201 and a probe terminal 202, respectively, that are used to measure a current that flows through the photoelectric conversion layer 12. The probe terminal 201 and the probe terminal 202 are connected to a measurement unit 200. The measurement unit 200 measures a current that flows between the electrode pad 51 and the electrode pad 52 by applying a voltage between the electrode pad 51 and the electrode pad 52 via the probe terminal 201 and the probe terminal 202. The measurement unit 200 may be an ammeter, for example.

In the imaging elements manufactured from the wafer 1, the electrode pad 51 may be used as a power supply terminal that is used to supply a voltage to the counter electrode 13. In the imaging elements manufactured from the wafer 1, the electrode pad 52 may be used as a power supply terminal that is used to supply a voltage to the shield electrode 17.

The electrode pad 51 and the electrode pad 52 are disposed in the imaging element area A1 and outside the photoelectric converter 20 in a plan view. The electrode pad 51 and the electrode pad 52 are disposed so as to interpose the photoelectric converter 20. The arrangement of the electrode pad 51 and the electrode pad 52 is not specifically limited as long as the electrode pad 51 and the electrode pad 52 are exposed to the outside of the wafer 1.

The extraction electrode 55 is an electrode to supply power to the counter electrode 13. The extraction electrode 55 is provided on the interlayer insulating layer 62. The extraction electrode 55 is disposed in a region of the interlayer insulating layer 62 outside a region in which the plurality of pixel electrodes 11 and the shield electrode 17 are provide in a plan view. The extraction electrode 55 does not overlap the photoelectric conversion layer 12, and is disposed around a region in which the photoelectric conversion layer 12 is provided, in a plan view.

The above wafer 1 can be manufactured using a common semiconductor manufacturing process and film formation process. In particular, a variety of silicon semiconductor processes can be used when a silicon substrate is used as the semiconductor substrate 61.

Inspection Method

Next, an inspection method in which the wafer 1 according to the present embodiment is used will be described. In the inspection method according to the present embodiment, the quality of the photoelectric conversion layer 12 provided in the imaging elements is inspected.

Figure 4:
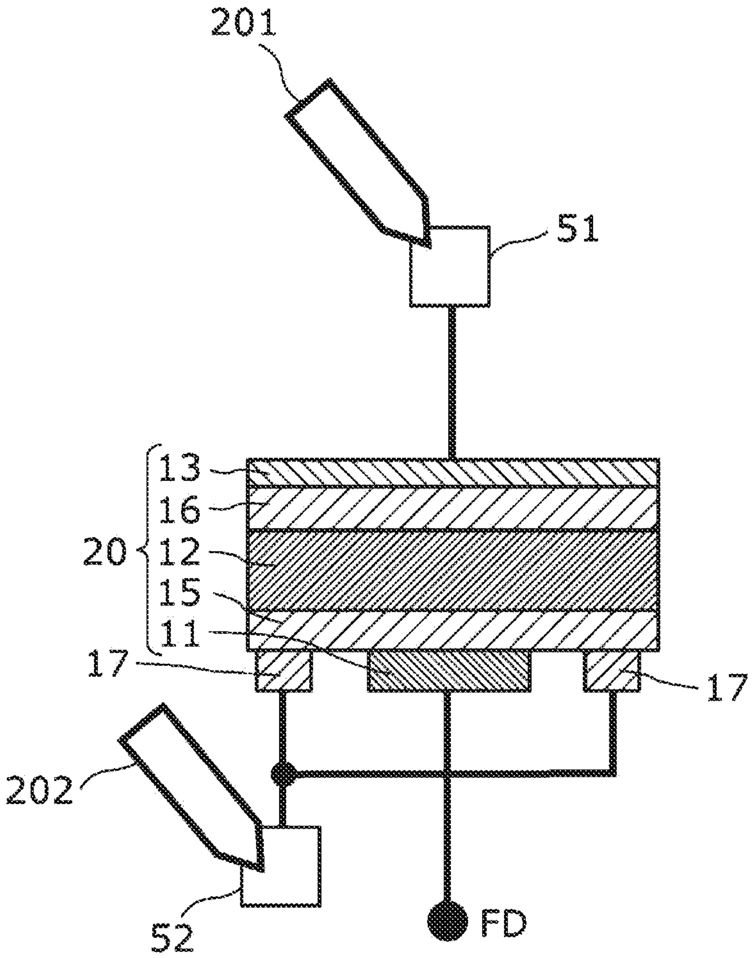
FIG. 4 is a schematic sectional view of a region corresponding to a single pixel of the wafer according to the embodiment.

FIG. 4 is a schematic sectional view of a region corresponding to a single pixel in the imaging element area A1 of the wafer 1. As illustrated in FIG. 4, each pixel can be regarded as a three-terminal element that includes the counter electrode 13 disposed above the photoelectric conversion layer 12, and the pixel electrode 11 and the shield electrode 17 disposed below the photoelectric conversion layer 12. The counter electrode 13 is electrically connected to the electrode pad 51. The shield electrode 17 is electrically connected to the electrode pad 52.

When signal reading is performed by an imaging element manufactured from the wafer 1, a signal charge generated in the photoelectric conversion layer 12 by applying a bias voltage between the counter electrode 13 and the pixel electrode 11 is collected by the pixel electrode 11, and read as a signal for each pixel by a reading circuit. On the other hand, the shield electrode 17 operates to suppress crosstalk, and thus a signal is not read from the shield electrode 17.

When the pixel electrode 11 is structured to be connected to another electrode such as the electrode pad 51, the capacitance of the charge accumulator 41 connected to the pixel electrode 11 increases to reduce the sensitivity of the imaging element. Specifically, when the pixel electrode 11 is connected to the electrode pad 51, a parasitic capacitance such as the capacity of a wire connected to the electrode pad 51 and of the electrode pad 51 itself is added to the charge accumulator 41, degrading a conversion gain which is important for the reading sensitivity. Since the pixel electrodes 11 are intended to read a signal separately pixel by pixel, the pixel electrodes 11 for the respective pixels are electrically separated from each other. Therefore, when measuring a current that flows between a single pixel electrode 11 and the counter electrode 13, the area of the single pixel electrode 11 itself is significantly small, and therefore the amount of the current that flows between the single pixel electrode 11 and the counter electrode 13 is also significantly small. Meanwhile, the shield electrode 17 in the wafer 1 according to the present embodiment is extended in a pixel array as a region of the imaging element area A1 in which the plurality of pixel electrodes 11 are disposed, and connected to the electrode pad 52. The shield electrode 17 has the same potential over the pixel array. Since the shield electrode 17 is not used to read a signal, unlike the pixel electrode 11, the sensitivity of the imaging element is not affected even if the shield electrode 17 is directly connected to the electrode pad 51.

In the inspection method according to the present embodiment, which focuses on the above, the quality of the photoelectric conversion layer 12 provided in each imaging element area A1 is inspected by measuring a current between the electrode pad 51 electrically connected to the counter electrode 13 and the electrode pad 52 electrically connected to the shield electrode 17.

Figure 5:
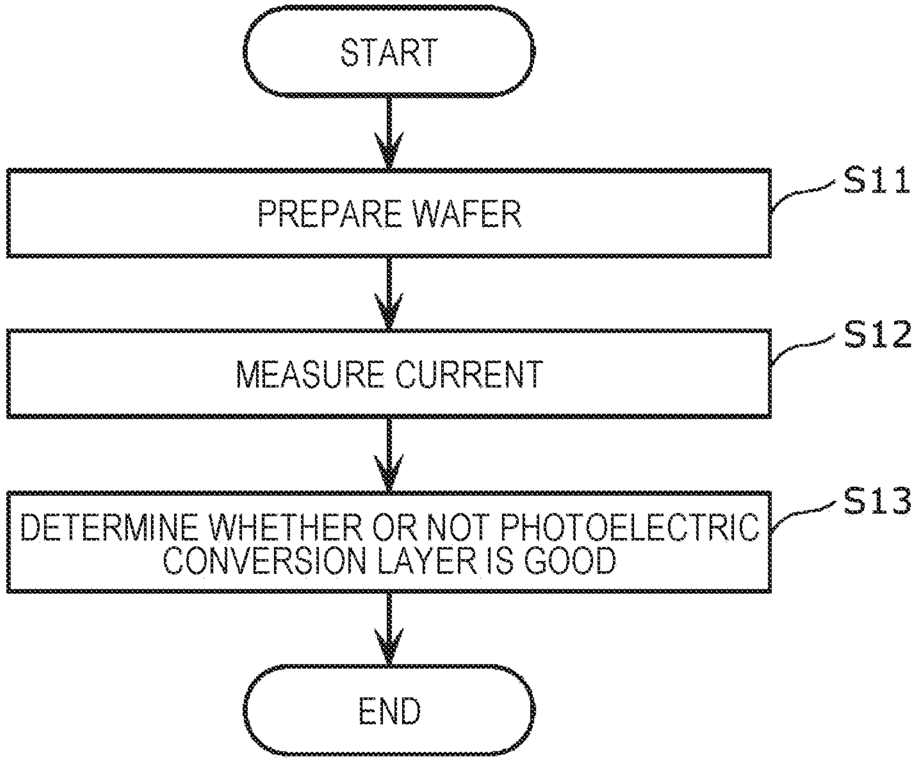
FIG. 5 is a flowchart of an inspection method according to the embodiment.

FIG. 5 is a flowchart of the inspection method according to the embodiment.

In the inspection method according to the present embodiment, as illustrated in FIG. 5, a wafer 1 is first prepared for inspection (step S11). For example, a fabricated wafer 1 is disposed at an inspection location.

Next, a current that flows between the electrode pad 51 and the electrode pad 52 in each imaging element area A1 of the prepared wafer 1 is measured by applying a voltage between the electrode pad 51 and the electrode pad 52 (step S12). For example, the current is measured using the measurement unit 200 by bringing the probe terminal 201 into contact with the electrode pad 51 and bringing the probe terminal 202 into contact with the electrode pad 52. Consequently, a voltage can be applied between the counter electrode 13 and the shield electrode 17 via the electrode pad 51 and the electrode pad 52 to measure a current that flows through the photoelectric conversion layer 12 between the counter electrode 13 and the shield electrode 17. The quality of the photoelectric conversion layer 12 can be inspected by measuring a current that flows through the photoelectric conversion layer 12 and checking whether or not the current has a current value based on desired current-voltage characteristics of the photoelectric conversion layer 12, as discussed in detail later.

The probe terminal 201, 202 may be considered to correspond to a probe card that is used in a wafer inspection according to the related art. The measurement unit 200 may be considered to correspond to a part of a wafer inspection circuit or an ammeter or a voltmeter connected to be used.

In step S12, the measurement of a current between the electrode pad 51 and the electrode pad 52 is performed for each of the plurality of imaging element areas A1. The measurement of a current between the electrode pad 51 and the electrode pad 52 may be performed for each of the imaging element areas A1, or may be performed collectively for two or more imaging element areas A1 using two or more probe terminals 201 and 202.

Next, it is determined on the basis of the current measured in step S12 whether or not the photoelectric conversion layer 12 is good (step S13). The determination as to whether good or not may be made on the basis of a current value at the time when a predetermined voltage is applied between the electrode pad 51 and the electrode pad 52, for example. Alternatively, the determination as to whether good or not may be made on the basis of the current-voltage characteristics between the electrode pad 51 and the electrode pad 52.

Here, the voltage to be applied between the electrode pad 51 and the electrode pad 52 and the determination as to whether or not the photoelectric conversion layer 12 is good will be described in detail.

For example, in step $12 discussed above, a predetermined voltage is applied between the electrode pad 51 and the electrode pad 52. Then, in step S13, it is determined whether or not the photoelectric conversion layer 12 is good on the basis of the value of a current that flows between the electrode pad 51 and the electrode pad 52, that is, the value of a current that flows through the photoelectric conversion layer 12, when the predetermined voltage is applied between the electrode pad 51 and the electrode pad 52.

Here, the voltage to be applied between the electrode pad 51 and the electrode pad 52 will be described with reference to FIG. 6.

Figure 6:
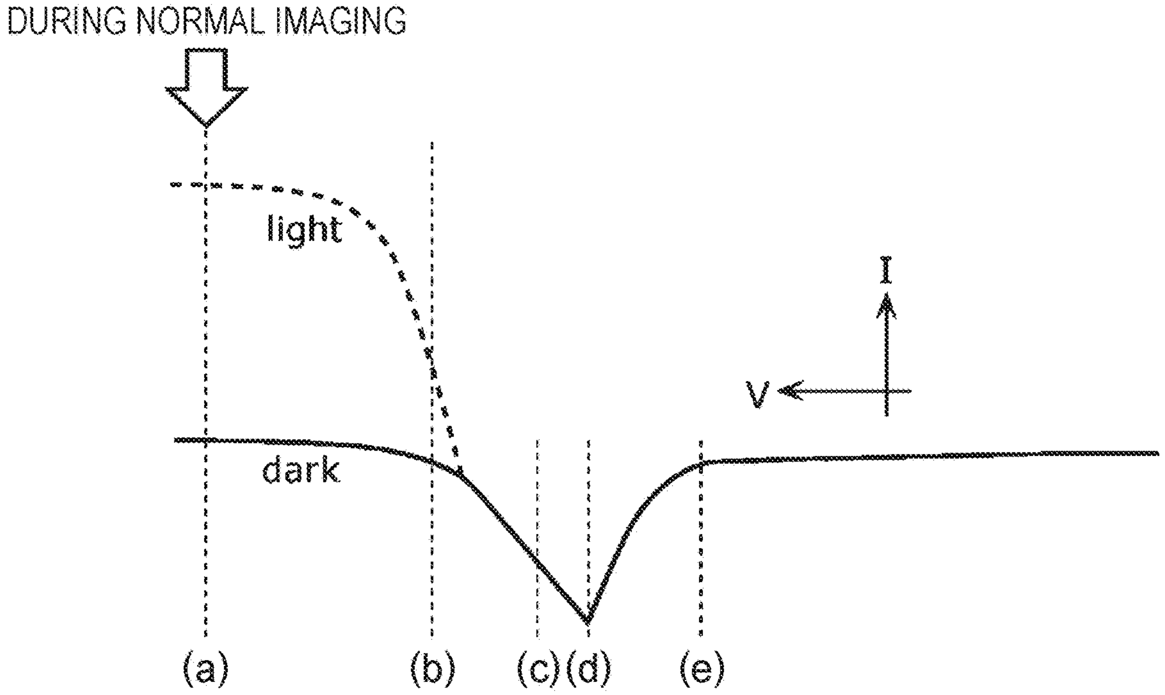
FIG. 6 illustrates an example of the current-voltage characteristics of a photoelectric conversion layer according to the embodiment.

FIG. 6 illustrates an example of the current-voltage characteristics of the photoelectric conversion layer 12. The horizontal axis indicated in FIG. 6 indicates a bias voltage applied to the photoelectric conversion layer 12. The vertical axis indicated in FIG. 6 indicates the absolute value of a current that flows through the photoelectric conversion layer 12. FIG. 6 is a semilogarithmic graph in which the vertical axis is presented on a logarithmic scale. The solid line labeled as "dark" in FIG. 6 indicates the current-voltage characteristics at dark times when the photoelectric conversion layer 12 is not irradiated with light. The broken line labeled as "light" in FIG. 6 indicates the current-voltage characteristics at light times when the photoelectric conversion layer 12 is irradiated with light with a predetermined intensity. The labels "dark" and "light" are also used in the same manner in FIGS. 7 and 8 to be discussed later.

In FIG. 6, when the photoelectric conversion layer 12 is regarded as a photodiode, a reverse bias voltage is applied on the left side of (d), and a forward bias voltage is applied on the right side of (d). In the present embodiment, a reverse bias voltage is applied when the potential of the counter electrode 13 is higher than the potential of the pixel electrode 11 or the shield electrode 17. On the other hand, a forward bias voltage is applied when the potential of the counter electrode 13 is lower than the potential of the pixel electrode 11 or the shield electrode 17.

During photoelectric conversion to acquire an image, a reverse bias voltage (e.g., about 5 V) at the position indicated by (a) is applied to the photoelectric conversion layer 12, for example. Consequently, a photoelectric current due to a carrier generated in accordance with the amount of light incident on the photoelectric conversion layer 12 flows, and a signal charge is collected by the pixel electrode 11. With the reverse bias voltage at the position indicated by (a), the photoelectric current is varied slightly even if the signal charge is collected by the pixel electrode 11, the potential of the pixel electrode 11 is varied, and the voltage applied to the photoelectric conversion layer 12 is varied, suppressing fluctuations in sensitivity. With the voltage indicated by (a), the value of a photoelectric current and the value of a dark current that flow through the photoelectric conversion layer 12 are substantially different. For example, the photoelectric current value is 10 times or more larger than the dark current value.

For example, when inspecting the photoelectric conversion layer 12 having the current-voltage characteristics indicated in FIG. 6, a current is measured with the voltage indicated by (a) in FIG. 6 applied between the electrode pad 51 and the electrode pad 52, and it is checked whether or not the current has a desired current value. For example, a threshold for determining a conforming product is determined in accordance with known current-voltage characteristics and the area of the pixel array, and a determination is made using data acquired from the measurement unit 200. That is, a product is determined as being defective when the measured current value is equal to or more than a predetermined current value, and determined as a conforming product when the measured current value is less than the predetermined current value. When there is a deficiency in the photoelectric conversion layer 12, charges are injected into the photoelectric conversion layer 12 from the electrodes by a bias voltage, increasing the current value. Therefore, it can be determined that the photoelectric conversion layer 12 is a defective product when the measured current value is equal to or more than the predetermined current value. Hence, it can be determined conveniently and accurately whether or not the photoelectric conversion layer 12 is good.

In a specific example, a dark current is measured with the wafer 1 shielded from light. The photoelectric conversion layer 12 is determined as being defective when the measured dark current value is equal to or more than a predetermined current value, and the photoelectric conversion layer 12 is determined as a conforming product when the measured dark current value is less than the predetermined current value. When measuring the dark current, the inspection can be stably performed without the need for light amount adjustment, compared to when measuring the photoelectric current which requires light amount adjustment. At a signal level at which detection is difficult with only measurement of a dark current, the determination as to whether good or not may be made by irradiating the wafer with adjusted uniform light and measuring a photoelectric current. Alternatively, the determination as to whether good or not may be made on the basis of both the photoelectric current value and the dark current value by measuring both the dark current and the photoelectric current.

The voltage to be applied between the electrode pad 51 and the electrode pad 52 is not limited to the voltage indicated by (a) in FIG. 6, and a different voltage may be applied.

For example, the voltage indicated by (b) or (c) in FIG. 6 may be applied between the electrode pad 51 and the electrode pad 52. At the voltages indicated by (b) and (c) in FIG. 6, the photoelectric current is sufficiently low. For example, the photoelectric current values at the voltages indicated by (b) and (c) in FIG. 6 are one-tenth or less of the photoelectric current value at the voltage indicated by (a) in FIG. 6. By using this, it may be determined whether or not the photoelectric conversion layer 12 is good on the basis of the difference between the photoelectric current value and the dark current value by measuring both the dark current and the photoelectric current. For example, the photoelectric conversion layer 12 is determined as being defective when the difference between the photoelectric current value and the dark current value is equal to or more than a predetermined value, and the photoelectric conversion layer 12 is determined as a conforming product when the difference is less than the predetermined value.

Consequently, the determination can be made in accordance with whether or not there is a deviation between the photoelectric current and the dark current at a voltage at which there should not be a significant deviation between the photoelectric current and the dark current.

For example, the voltage indicated by (d) in FIG. 6 may be applied between the electrode pad 51 and the electrode pad 52. The dark current becomes lowest around the voltage indicated by (d) in FIG. 6. Therefore, the lower limit of the dark current value can be found by measuring a dark current that flows when the voltage indicated by (d) in FIG. 6 is applied.

At voltages in the range indicated by (c) to (e) in FIG. 6, the photoelectric current and the dark current are substantially the same, and therefore the inspection can be performed with no influence of whether or not the wafer 1 is irradiated with light, by applying a voltage in this range between the electrode pad 51 and the electrode pad 52.

Among the voltages described above, a voltage in the range between (a) and (b) in FIG. 6 is a voltage to be applied to the photoelectric conversion layer 12 during photoelectric conversion to acquire an image. Therefore, inspection for practical use can be conveniently performed by applying a voltage in this range between the electrode pad 51 and the electrode pad 52 and measuring a current with the wafer 1 shielded from light or with the amount of light for the wafer 1 appropriately controlled.

A plurality of voltages may be applied between the electrode pad 51 and the electrode pad 52. For example, in step S12 discussed above, the current-voltage characteristics between the electrode pad 51 and the electrode pad 52 may be measured by monitoring the voltage applied between the electrode pad 51 and the electrode pad 52 and the current between the probe terminals 201, 202 while sweeping the applied voltage. In this case, in step S13, it is determined whether or not the photoelectric conversion layer 12 is good on the basis of the measured current-voltage characteristics.

For example, current-voltage characteristics are measured by applying a plurality of voltages in the voltage range indicated by the current-voltage characteristics indicated in FIG. 6 (e.g., voltages at three points (a), (b), and (c) indicated in FIG. 6) between the electrode pad 51 and the electrode pad 52. Then, it is determined whether or not the photoelectric conversion layer 12 is good on the basis of the slope of the measured current-voltage characteristics. For example, it is determined that the photoelectric conversion layer 12 is defective when the slope of the measured current-voltage characteristics is not in a predetermined range, and it is determined that the photoelectric conversion layer 12 is a conforming product when the slope is in the predetermined range. Alternatively, a plurality of slopes may be used, and it may be determined that the photoelectric conversion layer 12 is defective when the difference in magnitude between the plurality of slopes is not in a predetermined range, and it may be determined that the photoelectric conversion layer 12 is a conforming product when the difference is in the predetermined range.

Consequently, it is possible to expect that the sensitivity of the measurement unit 200 will be compensated for, and that abrupt variations in current value for variations in voltage, etc., will be detected with high sensitivity, enhancing the inspection accuracy. The predetermined range is set on the basis of known current-voltage characteristics of the photoelectric conversion layer 12 measured in an advance test, etc., to a range in which the difference of the slope of the measured current-voltage characteristics from the slope of the known current-voltage characteristics is equal to or less than a predetermined value, for example. It may be determined whether or not the photoelectric conversion layer 12 is good on the basis of the current value in the measured current-voltage characteristics. For example, it is determined that the photoelectric conversion layer 12 is defective when the difference in current value between the known current-voltage characteristics and the measured current-voltage characteristics is equal to or more than a threshold, even if only partially, in the measured voltage range. A combination of the slope and the current value in the measured current-voltage characteristics may be used to determine whether or not the photoelectric conversion layer 12 is good.

In particular, when the photoelectric conversion layer 12 is irradiated with light, the current is significantly varied in accordance with the applied voltage. Therefore, inspection may be performed with the wafer 1 irradiated with light when sweeping the voltage applied between the electrode pad 51 and the electrode pad 52.

Here, another example of the voltage to be applied between the electrode pad 51 and the electrode pad 52 will be described.

Figure 7:
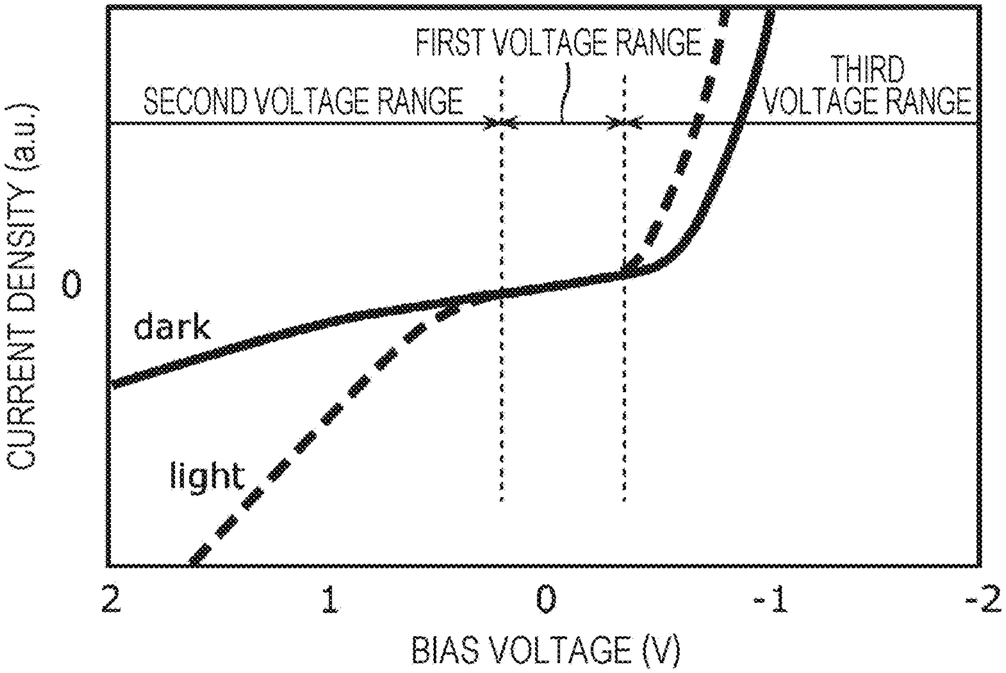
FIG. 7 illustrates current-voltage characteristics illustrating the range of a voltage to be used for global shutter operation.

For example, in step S12, the voltage to be applied between the electrode pad 51 and the electrode pad 52 may be determined on the basis of the range of a voltage to be used for global shutter operation. FIG. 7 illustrates current-voltage characteristics illustrating the range of a voltage to be used for global shutter operation. The horizontal axis indicated in FIG. 7 indicates a bias voltage applied to the photoelectric conversion layer 12. The vertical axis indicated in FIG. 7 indicates the value of a current that flows through the photoelectric conversion layer 12. In FIG. 7, the current value on the vertical axis is not an absolute value. In FIG. 7, the vertical axis is not a logarithmic axis, but is a normal linear axis.

The photoelectric current characteristics of the photoelectric conversion layer 12 in the example illustrated in FIG. 7 are schematically characterized by a first voltage range, a second voltage range, and a third voltage range. The second voltage range is a voltage range with a reverse bias, and is a region in which the absolute value of the output current density increases in accordance with an increase in the reverse bias voltage. The third voltage range is a voltage range with a forward bias, and is a region in which the output current density increases in accordance with an increase in the forward bias voltage. The first voltage range is a voltage range interposed between the second voltage range and the third voltage range. The first voltage range is a voltage range in which the density of a current that flows through the photoelectric conversion layer 12 when a voltage is applied to the photoelectric conversion layer 12 is equivalent between a state in which light is incident on the photoelectric conversion layer 12 and a state in which no light is incident on the photoelectric conversion layer 12, that is, the photoelectric current and the dark current are equivalent to each other. The current density being equivalent between a state in which light is incident on the photoelectric conversion layer 12 and a state in which no light is incident on the photoelectric conversion layer 12 means that the current density is substantially equivalent between the two states. For example, in the first voltage range, the ratio between the absolute value of the current density in a state with light incidence and the absolute value of the current density in a state with no light incidence is more than 1:10 and less than 10:1. The state with light incidence may involve irradiation with light at 100 $mW/cm^2$, for example. When the standard indoor illumination is taken into consideration, the state with light incidence may involve irradiation with light at 50 $\mu W/cm^2$ or more, for example.

In the global shutter operation, a voltage in the second voltage range is applied to the photoelectric conversion layer 12 for a light exposure period, and a voltage in the first voltage range is applied to the photoelectric conversion layer 12 for a non-light exposure period in which signal charges are read, etc. When a voltage in the first voltage range is applied, the photoelectric conversion layer 12 is not substantially sensitive, and therefore signal charges are not accumulated during reading from each pixel, enabling the global shutter operation.

The voltage applied between the electrode pad 51 and the electrode pad 52 in step S12 may be a voltage in a voltage range selected from the first voltage range, the second voltage range, and the third voltage range indicated in FIG. 7. For example, the magnitude of the sensitivity during the non-light exposure period in which signal reading is performed can be inspected by applying a voltage in the first voltage range between the electrode pad 51 and the electrode pad 52. The voltage applied between the electrode pad 51 and the electrode pad 52 may be one or more selected from each of the first voltage range, the second voltage range, and the third voltage range.

Figure 8:
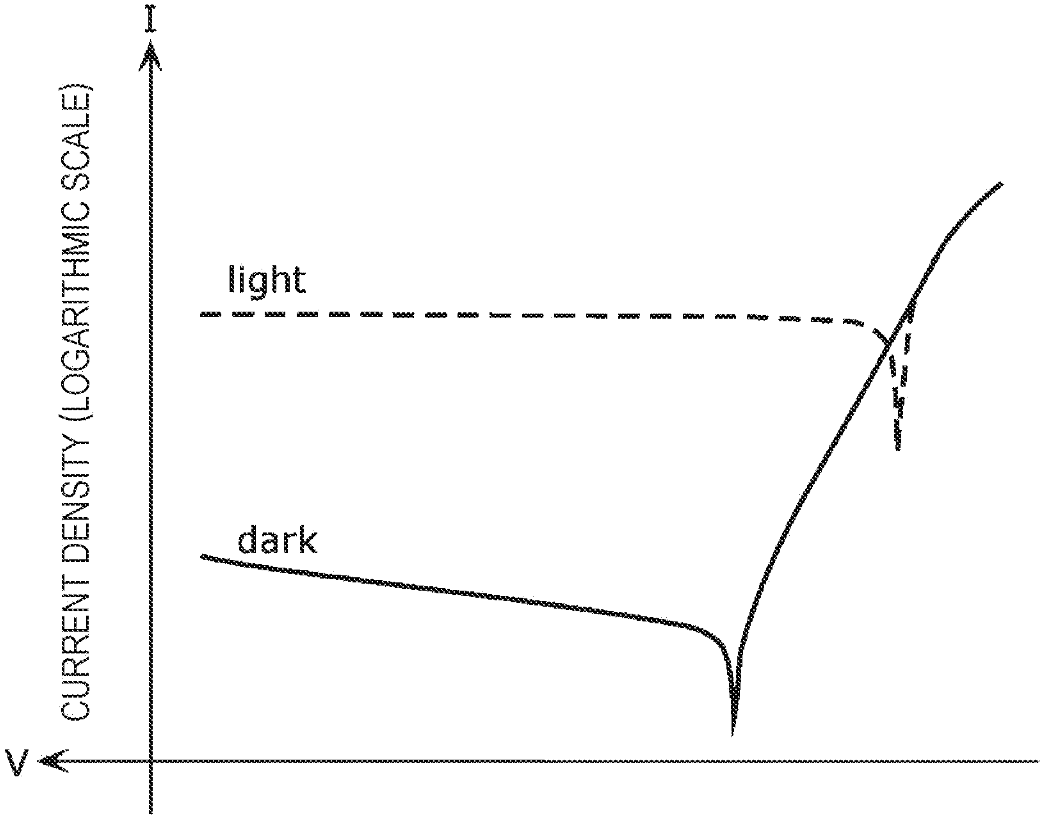
FIG. 8 illustrates another example of the current-voltage characteristics of the photoelectric conversion layer according to the embodiment.

The photoelectric conversion layer 12 may have current-voltage characteristics different from the current-voltage characteristics indicated in FIGS. 6 and 7. FIG. 8 illustrates another example of the current-voltage characteristics of the photoelectric conversion layer 12. FIG. 8 indicates current-voltage characteristics that may be achieved when a semiconductor quantum dot is used as a photoelectric conversion material, for example. As with FIG. 6, the horizontal axis indicated in FIG. 8 indicates a bias voltage applied to the photoelectric conversion layer 12. The vertical axis indicated in FIG. 8 indicates the absolute value of a current that flows through the photoelectric conversion layer 12. FIG. 8 is a semilogarithmic graph in which the vertical axis is presented on a logarithmic scale.

In the current-voltage characteristics indicated in FIG. 8, there is a conspicuous difference between the photoelectric current and the dark current, and there is substantially no voltage range in which the photoelectric current value and the dark current value are equivalent to each other. Therefore, a predetermined voltage may be applied between the electrode pad 51 and the electrode pad 52 to measure both the photoelectric current value and the dark current value. Consequently, the inspection accuracy can be enhanced. It is also possible to measure only the dark current value, shortening the inspection time.

While the current-voltage characteristics of the photoelectric conversion layer 12 have been described with reference to FIGS. 6 to 8, the current-voltage characteristics indicated in FIGS. 6 to 8 may be the characteristics of the entire photoelectric converter 20.

When measuring one of the photoelectric current and the dark current in step S12, which one to measure may be determined on the basis of the wavelength to which the photoelectric conversion layer 12 is sensitive. The dark current tends to become higher particularly as the wavelength to which the photoelectric conversion layer 12 is sensitive becomes longer. This is because the band gap of the materials of the photoelectric conversion layer 12 themselves is narrowed, and therefore a carrier is generated in the photoelectric conversion layer 12 through thermal excitation, causing a dark current. Therefore, the dark current may be measured when the photoelectric conversion layer 12 is sensitive to near-infrared to short-wave infrared wavelengths. On the other hand, the photoelectric current may be measured when the photoelectric conversion layer 12 is only sensitive to visible wavelengths or less.

As described above, the inspection method according to the present embodiment includes preparing a wafer 1, and measuring a current that flows between the electrode pad 51 and the electrode pad 52 of the wafer 1 by applying a voltage between the electrode pad 51 and the electrode pad 52. Consequently, the quality of the photoelectric conversion layer 12 can be inspected by measuring a current that flows through the photoelectric conversion layer 12 between the counter electrode 13 and the shield electrode 17, since the electrode pad 51 is electrically connected to the counter electrode 13 and the electrode pad 52 is electrically connected to the shield electrode 17.

In the present embodiment, the inspection of the quality of the photoelectric conversion layer 12 is performed on a scale for the purpose of detecting fluctuations within the surface of the wafer 1 and determining whether each imaging element area A1 of the wafer 1 is a conforming product or a defective product, for example. Meanwhile, fluctuations among pixels in the same imaging element area A1 are detectable through an image viewing inspection, etc. A local white flaw and an excessive dark current for each pixel can be corrected through image processing, depending on the scale, and thus it is considered to be less necessary to perform inspection for such defects in the manufacturing process.

When the photoelectric conversion layer 12 is formed on the surface of the wafer 1 by a film formation method such as spin coat, there is a possibility of the occurrence of a non-uniform film thickness, uneven coating, etc., the occurrence of a crack, etc. It can be determined whether or not the photoelectric conversion layer 12 is good on the basis of such faults, by measuring a current that flows through the photoelectric conversion layer 12 by the inspection method according to the present embodiment. Not only during film formation but also after the photoelectric converter 20 is formed on the entire surface of the wafer 1, patterning is performed in accordance with the shape of the region in which the plurality of pixel electrodes 11 are formed, and a process of forming an opening is performed at the electrode pad portions. Defects of the photoelectric conversion layer 12 due to the influence of damage to the photoelectric conversion layer 12 due to such processes also can be detected by the inspection method according to the present embodiment.

By finding defects of the photoelectric conversion layer 12 in an early stage of the manufacturing process, defective products can be removed before being diced or packaged in the subsequent process of manufacturing imaging elements, suppressing an increase in package assembly cost and package cost. An increase in cost for a process of fabricating camera modules from imaging elements after being packaged, etc., also can be suppressed.

The inspection can also be performed by outputting an image with the wafer 1 irradiated with light or shielded from light. However, that requires construction of an inspection program for outputting an image, and a complicated inspection sequence with connection of a probe card, and accumulation of signals is required for imaging, causing an issue of an increased inspection time, etc. Therefore, the method of measuring a current between the electrode pad 51 and the electrode pad 52 by connecting the probe terminals 201, 202 for inspection to the electrode pads 51, 52, as in the inspection method according to the present embodiment, is significantly simple, and does not require a change of a probe card required for inspection or the addition of a new structure for inspection, for example. Therefore, the inspection method according to the present embodiment is highly effective in being applicable to any product model and product number.

In the inspection method according to the present embodiment, a current that flows through the photoelectric conversion layer 12 can be measured between the shield electrode 17, which is disposed between the plurality of pixel electrodes 11, and the counter electrode 13. Therefore, it is not necessary to provide the wafer 1 with a region for inspection, improving the yield of imaging elements, compared to the case where an inspection is performed with the wafer 1 provided with a test pattern including the photoelectric conversion layer 12 formed separately from the photoelectric converter 20. Further, the photoelectric conversion layer 12 as a region to be used for imaging can be directly inspected over a large area, improving the inspection accuracy.

Configuration of Imaging Element

Next, the configuration of the imaging element 100 manufactured from the wafer 1 will be described. In the following description of the imaging element 100, the description of commonalities with the wafer 1 will be omitted or simplified.

Figure 9:
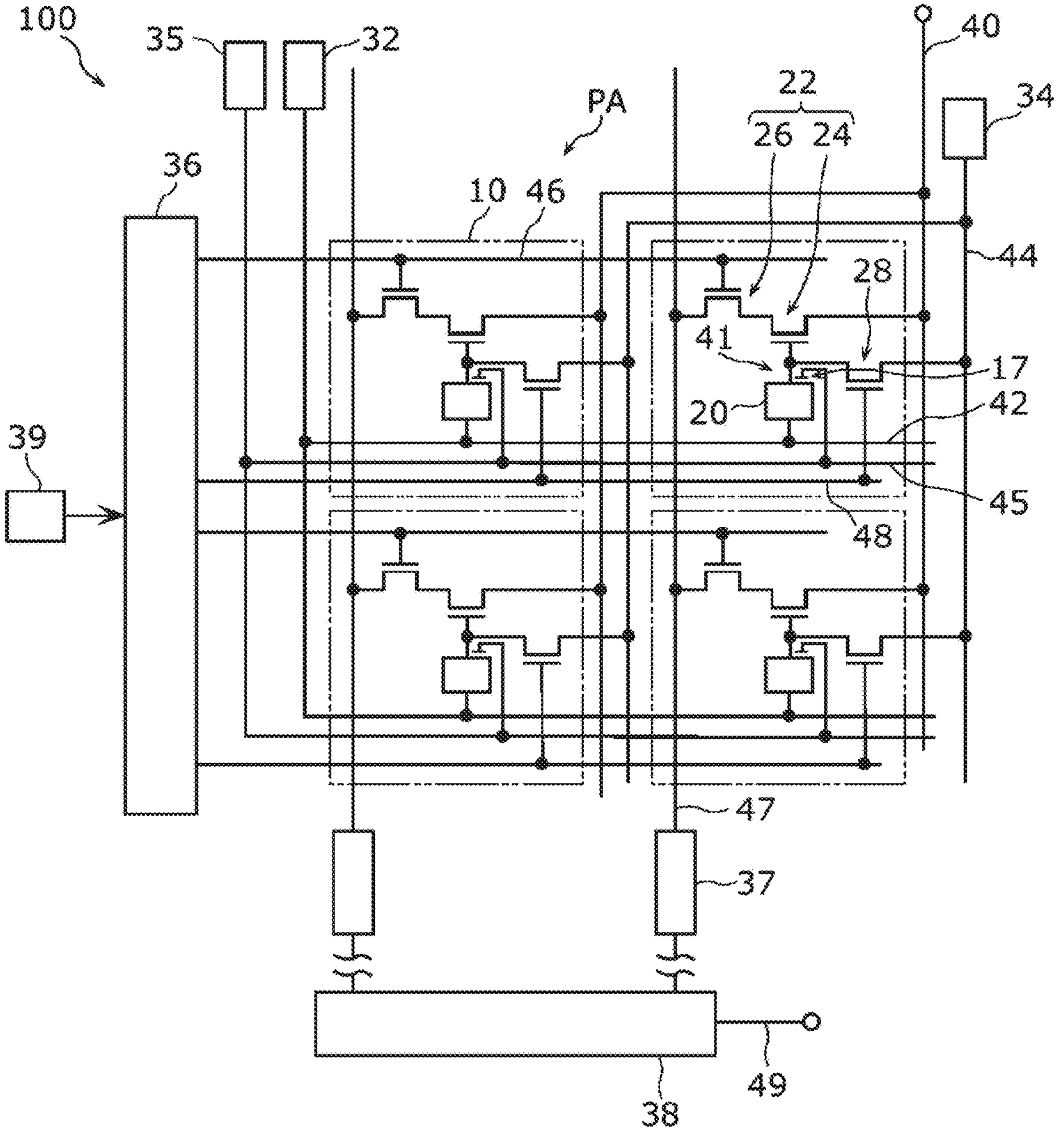
FIG. 9 is a schematic diagram illustrating an exemplary circuit configuration of an imaging element according to the embodiment.

FIG. 9 is a schematic diagram illustrating an exemplary circuit configuration of the imaging element 100 according to the present embodiment. The imaging element 100 illustrated in FIG. 9 includes a pixel array PA that includes a plurality of pixels 10 arranged two-dimensionally. The pixel array PA forms an imaging surface of the imaging element 100, for example. FIG. 9 schematically illustrates an example in which the pixels 10 are disposed in a matrix of two rows and two columns. The number and the arrangement of the pixels 10 in the imaging element 100 are not limited to those of the example illustrated in FIG. 9.

Each pixel 10 includes a photoelectric converter 20, a signal detection circuit 22, a reset transistor 28, a charge accumulator 41, and a shield electrode 17.

The photoelectric converter 20 includes the pixel electrode 11, the photoelectric conversion layer 12, the counter electrode 13, the electron blocking layer 15, and the hole blocking layer 16, which are provided in the imaging element area A1 in the wafer 1. The photoelectric converter 20 receives incident light to generate signal charges. It is not necessary that the entire photoelectric converter 20 should be an independent element for each of the pixels 10, and a portion of the photoelectric converter 20 may be provided in common for a plurality of pixels 10, for example.

The signal detection circuit 22 is a circuit that detects the signal charges generated by the photoelectric converter 20. In this example, the signal detection circuit 22 includes a signal detection transistor 24 and an address transistor 26. The signal detection transistor 24 and the address transistor 26 may each be a field-effect transistor (FET), for example. Here, the signal detection transistor 24 and the address transistor 26 are exemplified by an N-channel metal oxide semiconductor field-effect transistor (MOSFET). Each transistor, such as the signal detection transistor 24, the address transistor 26, and the reset transistor 28 to be discussed later, includes a control terminal, an input terminal, and an output terminal. The control terminal is a gate, for example. The input terminal is one of a drain and a source, and is a drain, for example. The output terminal is the other of a drain and a source, and is a source, for example.

As schematically illustrated in FIG. 9, the control terminal of the signal detection transistor 24 is electrically connected to the photoelectric converter 20. The signal charges generated by the photoelectric converter 20 are accumulated in the charge accumulator 41. The charge accumulator 41 is spread in a region including a region between the gate of the signal detection transistor 24 and the photoelectric converter 20. The signal charges are positive or negative charges, and are holes or electrons, for example.

The imaging element 100 includes peripheral circuits directly or indirectly connected to the photoelectric converter 20. The peripheral circuits drive the pixel array PA, and acquire an image on the basis of the signal charges generated by the photoelectric converter 20, for example. The peripheral circuits include a voltage supply circuit 32, a voltage supply circuit 35, a reset voltage source 34, a vertical scanning circuit 36, column signal processing circuits 37, a horizontal signal reading circuit 38, and a pixel drive signal generation circuit 39, for example. All of the circuits of the peripheral circuits may be provided in the CMOS circuit layer 60, or at least one of the circuits may be provided outside the CMOS circuit layer 60. For example, the voltage supply circuit 32 and the voltage supply circuit 35 are each provided on a printed circuit board, a power supply board, etc., outside the CMOS circuit layer 60, for example. In this case, the electrode pad 51 and the electrode pad 52 function as terminals to be connected to the voltage supply circuit 32 and the voltage supply circuit 35 provided on the printed circuit board, the power supply board, etc., outside the CMOS circuit layer 60.

The photoelectric converter 20 of each pixel 10 has a connection with a sensitivity control line 42. In the configuration illustrated in FIG. 9, the sensitivity control line 42 is connected to the voltage supply circuit 32. The voltage supply circuit 32 supplies a voltage to the counter electrode 13 of the photoelectric converter 20.

In the configuration illustrated in FIG. 9, the shield electrode 17 has a connection with a sensitivity control line 45. The sensitivity control line 45 is connected to the voltage supply circuit 35. The voltage supply circuit 35 supplies a voltage to the shield electrode 17. The shield electrode 17 and the pixel electrode 11 are electrically separated from each other.

The voltage supply circuit 32 and the voltage supply circuit 35 are not limited to particular power supply circuits, and may be circuits that generate a predetermined voltage, or may be circuits that convert a voltage supplied from another power supply into a predetermined voltage.

Each pixel 10 has a connection with a power supply line 40 that supplies a power supply voltage VDD. As illustrated in the drawing, the input terminal of the signal detection transistor 24 is connected to the power supply line 40. With the power supply line 40 functioning as a source follower power supply, the signal detection transistor 24 amplifies and outputs the signal charges generated by the photoelectric converter 20. Specifically, a voltage that matches the amount of signal charges accumulated in the charge accumulator 41 is applied to the control terminal of the signal detection transistor 24. The signal detection transistor 24 amplifies this voltage.

The input terminal of the address transistor 26 is connected to the output terminal of the signal detection transistor 24. The output terminal of the address transistor 26 is connected to one of a plurality of vertical signal lines 47 disposed for respective columns of the pixel array PA. The control terminal of the address transistor 26 is connected to an address control line 46. By controlling the potential of the address control line 46, an output of the signal detection transistor 24 can be selectively read and fed to the corresponding vertical signal line 47. Specifically, the voltage amplified by the signal detection transistor 24 as a signal voltage is selectively read and fed as a pixel signal via the address transistor 26.

In the illustrated example, the address control line 46 is connected to the vertical scanning circuit 36. The vertical scanning circuit 36 is also referred to as a "row scanning circuit". The vertical scanning circuit 36 selects the plurality of pixels 10 disposed in each row, row by row, by applying a predetermined voltage to the address control line 46. Consequently, signals are read from the selected pixels 10, and the potential of the charge accumulator 41 is reset.

Further, the pixel drive signal generation circuit 39 is connected to the vertical scanning circuit 36. In the illustrated example, the pixel drive signal generation circuit 39 generates a signal for driving the pixels 10 disposed in each row of the pixel array PA, and the generated pixel drive signal is supplied to the pixels 10 in the row selected by the vertical scanning circuit 36.

The vertical signal lines 47 are main signal lines that transfer pixel signals from the pixel array PA to the peripheral circuits. The column signal processing circuits 37 are connected to the vertical signal lines 47. The column signal processing circuits 37 are also referred to as "row signal accumulation circuits". The column signal processing circuits 37 perform a noise suppression signal process represented by correlated double sampling, an analog-digital (AD) conversion, etc. As illustrated in the drawing, the column signal processing circuits 37 are provided in correspondence with the respective columns of pixels 10 in the pixel array PA. The horizontal signal reading circuit 38 is connected to the column signal processing circuits 37. The horizontal signal reading circuit 38 is also referred to as a "column scanning circuit". The horizontal signal reading circuit 38 sequentially reads and feeds signals from the plurality of column signal processing circuits 37 to a horizontal common signal line 49.

The imaging element 100 may be driven in a global shutter mode, or may be driven in a rolling shutter mode. When driven in the global shutter mode, the voltage supply circuit 32 applies to the counter electrode 13 a voltage as a bias voltage in the second voltage range in the light exposure period, and applies to the counter electrode 13 a voltage as a bias voltage in the first voltage range in the non-light exposure period. Signals are read for each pixel row in the non-light exposure period.

In the configuration illustrated in FIG. 9, the pixels 10 each include a reset transistor 28. The reset transistor 28 may be a field-effect transistor, as with the signal detection transistor 24 and the address transistor 26, for example. Hereinafter, an example in which an N-channel MOSFET is applied as the reset transistor 28 will be described, unless otherwise stated. As illustrated in the drawing, the reset transistor 28 is connected between a reset voltage line 44 through which a reset voltage Vr is supplied and the charge accumulator 41. The control terminal of the reset transistor 28 is connected to a reset control line 48, and the potential of the pixel electrode 11 and the charge accumulator 41 can be reset to the reset voltage Vr by controlling the potential of the reset control line 48. In this example, the reset control line 48 is connected to the vertical scanning circuit 36. Thus, the plurality of pixels 10 disposed in each row can be reset, row by row, by the vertical scanning circuit 36 applying a predetermined voltage to the reset control line 48.

In this example, the reset voltage line 44 through which the reset voltage Vr is supplied to the reset transistor 28 is connected to the reset voltage source 34. The reset voltage source 34 is also referred to as a "reset voltage supply circuit". It is only necessary that the reset voltage source 34 should be configured to be able to supply the predetermined reset voltage Vr to the reset voltage line 44 during operation of the imaging element 100, and the reset voltage source 34 is not limited to a particular power supply circuit, as with the voltage supply circuit 32 discussed above. Each of the voltage supply circuit 32, the voltage supply circuit 35, and the reset voltage source 34 may be a portion of a single voltage supply circuit, or may be a separate independent voltage supply circuit. At least one of the voltage supply circuit 32, the voltage supply circuit 35, and the reset voltage source 34 may be a portion of the vertical scanning circuit 36. Alternatively, a sensitivity control voltage from the voltage supply circuit 32, a sensitivity control voltage from the voltage supply circuit 35, and/or the reset voltage Vr from the reset voltage source 34 may be supplied to each pixel 10 via the vertical scanning circuit 36.

The imaging element 100 may include a circuit that is used in a known image sensor other than those described above.

Figure 10:
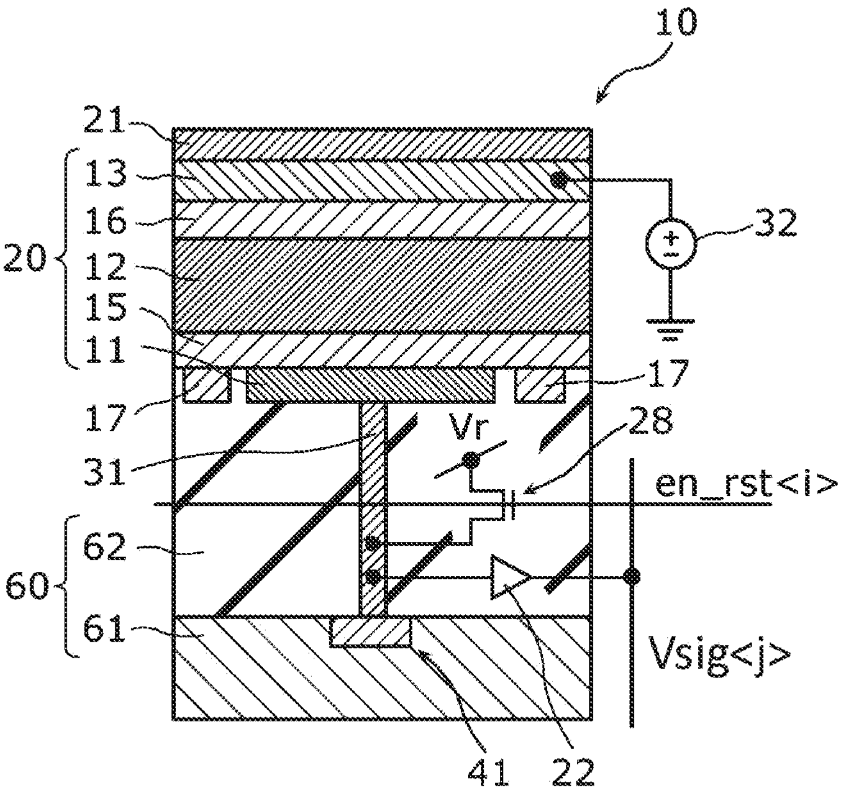
FIG. 10 is a sectional view illustrating an exemplary device structure of a pixel according to the embodiment.

Next, the device structure of the pixel 10 of the imaging element 100 will be described. FIG. 10 is a sectional view illustrating an exemplary device structure of the pixel 10 according to the present embodiment.

As illustrated in FIG. 10, the pixel 10 includes a CMOS circuit layer 60, a photoelectric converter 20 located above the CMOS circuit layer 60, a sealing layer 21 located above the photoelectric converter 20, a shield electrode 17, and a charge accumulator 41. The pixel 10 may further include an optical filter, a microlens, etc., above the sealing layer 21. Light is incident on the pixel 10 from above the sealing layer 21.

The photoelectric converter 20 includes a pixel electrode 11 electrically connected to the charge accumulator 41, a counter electrode 13 located above the pixel electrode 11 and disposed to face the pixel electrode 11, a photoelectric conversion layer 12 located between the pixel electrode 11 and the counter electrode 13, an electron blocking layer 15 located between the pixel electrode 11 and the photoelectric conversion layer 12, and a hole blocking layer 16 located between the counter electrode 13 and the photoelectric conversion layer 12. In the example illustrated in FIG. 10, the counter electrode 13, the photoelectric conversion layer 12, the electron blocking layer 15, and the hole blocking layer 16 are formed across a plurality of pixels 10.

Various transistors such as the signal detection circuit 22 and the reset transistor 28, wires such as signal lines, control lines, and power supply lines, the charge accumulator 41, etc., described in relation to FIG. 9, for example, are provided in the CMOS circuit layer 60 of each pixel 10, although not illustrated in FIG. 10 except for a part thereof. A plug 31 that connects the charge accumulator 41 and the pixel electrode 11 is provided in the interlayer insulating layer 62 of the CMOS circuit layer 60. The plug 31 is formed using a conductive material.

In FIG. 10, the signal detection circuit 22, the reset transistor 28, and control lines and signal lines connected to such components are schematically illustrated. A reset control line en_rst for each row is connected to the gate of the reset transistor 28. The signal detection circuit 22 outputs a pixel signal to a vertical signal line Vsig for each column. The reset control line en_rst corresponds to the reset control line 48 in FIG. 9. The vertical signal line Vsig corresponds to the vertical signal line 47 in FIG. 9. The pixel array PA is an array of n rows and m columns, for example. In FIG. 10, a pixel 10 in an i-th row and a j-th column of the pixel array PA is illustrated. Therefore, the reset control line en_rst<i> represents the reset control line en_rst for the i-th row, and the vertical signal line Vsig<j> represents the vertical signal line Vsig for the j-th column.

The pixel electrode 11 is an electrode that collects signal charges generated by the photoelectric conversion layer 12. At least one pixel electrode 11 is present in each pixel 10. Signal charges collected by the pixel electrode 11 are accumulated in the charge accumulator 41 via the plug 31. A voltage that matches the signal charges accumulated in the charge accumulator 41 is read by the signal detection circuit 22.

The photoelectric conversion layer 12 is located between the pixel electrode 11 and the counter electrode 13. The photoelectric conversion layer 12 is also located between the shield electrode 17 and the counter electrode 13.

The counter electrode 13 is disposed on the side of the photoelectric conversion layer 12 on which light is incident. Thus, light having passed through the counter electrode 13 is incident on the photoelectric conversion layer 12.

A voltage is applied to the counter electrode 13 from the voltage supply circuit 32. A bias voltage as the difference in potential between the counter electrode 13 and the pixel electrode 11 can be set to and maintained at a desired value by adjusting the voltage applied to the counter electrode 13 by the voltage supply circuit 32.

The counter electrode 13 is formed across a plurality of pixels 10, for example. Thus, a voltage with a desired magnitude can be collectively applied to the plurality of pixels 10 from the voltage supply circuit 32. The sensitivity of the photoelectric converter 20 can be adjusted by changing the voltage applied to the counter electrode 13. The counter electrode 13 may be provided separately for each of the pixels 10 as long as a voltage with a desired magnitude can be applied from the voltage supply circuit 32. Similarly, each of the photoelectric conversion layer 12, the electron blocking layer 15, and the hole blocking layer 16 may be formed across the plurality of pixels 10, or may be provided separately for each of the pixels 10.

The voltage applied to the photoelectric conversion layer 12 is the difference between a potential Vito of the counter electrode 13 and a potential Vfd of the charge accumulator 41. The potential Vfd of the charge accumulator 41 fluctuates in accordance with the amount of signal charges accumulated in accordance with the amount of light incident on the photoelectric conversion layer 12.

The shield electrode 17 is disposed to face the counter electrode 13 with the photoelectric conversion layer 12 interposed between the counter electrode 13 and the shield electrode 17. The shield electrode 17 is located below the photoelectric converter 20. The shield electrode 17 is in contact with the lower surface of the photoelectric converter 20. As discussed above, the shield electrode 17 has a connection with the sensitivity control line 45, and a voltage is applied to the shield electrode 17 from the voltage supply circuit 35 via the sensitivity control line 45, although not illustrated in FIG. 10. A part of the interlayer insulating layer 62 may be disposed between the shield electrode 17 and the photoelectric converter 20. That is, the shield electrode 17 and the photoelectric converter 20 may not be in contact with each other.

The shield electrode 17 is formed using a conductive material. The conductive material may be metal such as aluminum or copper, a metal nitride, or a polysilicon doped with impurities to be rendered conductive, for example.

The voltage applied to the shield electrode 17 can be used to suppress movement of signal charges between the pixels 10, or so-called crosstalk. Therefore, color mixture can be suppressed, even if the photoelectric conversion layer 12 is not physically separated. The voltage applied to the shield electrode 17 is set to a potential higher than that of the pixel electrode 11, for example. For example, a voltage higher than the reset voltage Vr is applied to the shield electrode 17. Consequently, holes can easily move to the pixel electrode 11 surrounded by the shield electrode 17 in a plan view, suppressing movement of holes to the pixel electrodes 11 of adjacent pixels 10 beyond the shield electrode 17.

The voltage applied to the shield electrode 17 may be set to a potential lower than that of the pixel electrode 11. For example, a voltage lower than the reset voltage Vr is applied to the shield electrode 17. Consequently, holes moving toward the pixel electrodes 11 of adjacent pixels 10 beyond the shield electrode 17 in a plan view can be collected by the shield electrode 17, suppressing movement of holes to the pixel electrodes 11 of adjacent pixels 10 beyond the shield electrode 17.

The imaging element 100 may not include the sensitivity control line 45 and the voltage supply circuit 35, and the shield electrode 17 may be connected to a ground of the imaging element 100. This also may suppress crosstalk.

Method of Manufacturing Imaging Element

Figure 11:
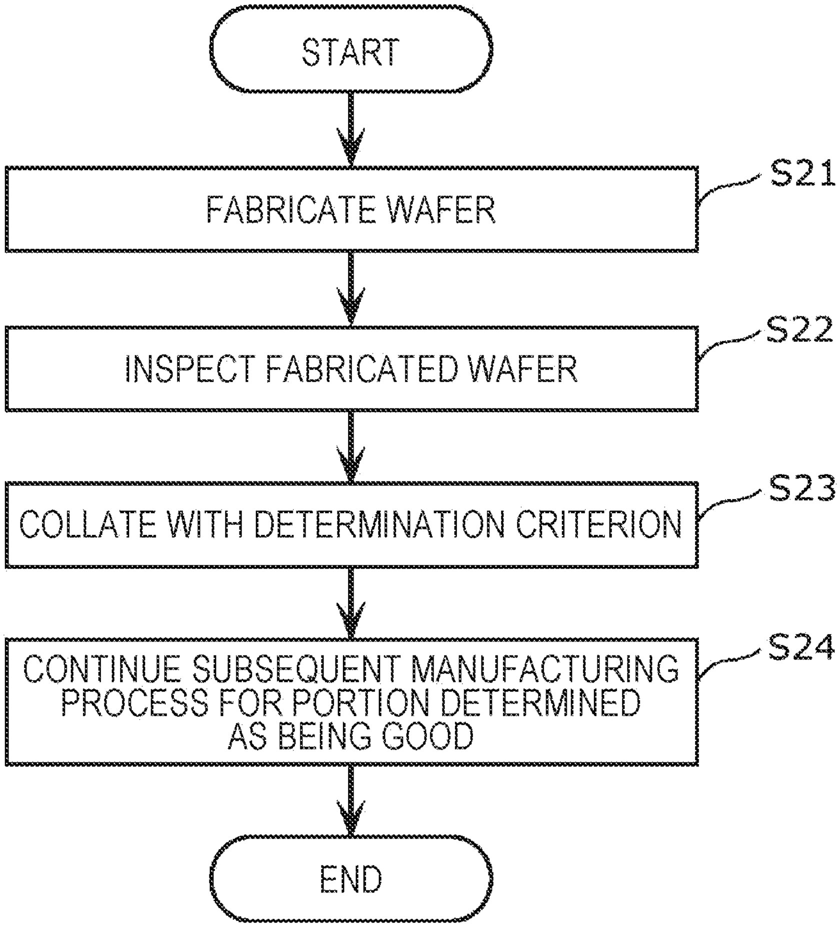
FIG. 11 is a flowchart of a method of manufacturing the imaging element according to the embodiment.

Next, a method of manufacturing the imaging element 100 according to the present embodiment will be described. FIG. 11 is a flowchart of a method of manufacturing the imaging element 100 according to the present embodiment.

In the method of manufacturing the imaging element 100, as illustrated in FIG. 11, a wafer 1 is first fabricated (step S21). For example, the wafer 1 illustrated in FIG. 2 can be fabricated using a common semiconductor manufacturing process and film formation process.

Next, the fabricated wafer 1 is inspected (step S22). In step S22, for example, an inspection is performed by the inspection method described in relation to steps S11 and S12 discussed above.

Next, the result of the inspection in step S22 is collated with a determination criterion (step S23). Specifically, it is determined whether or not the photoelectric conversion layer 12 is good by collating the result of the inspection in step S22 with the determination criterion. In step S23, the same method as in step S13 discussed above is used.

Next, the subsequent manufacturing process is continued for imaging element areas A1 including the photoelectric conversion layer 12 determined in step S23 as being good (step S24). That is, the subsequent manufacturing process is continued when it is determined in step S23 that the photoelectric conversion layer 12 is good. The subsequent manufacturing process includes chipping in which the wafer 1 is diced so as to be divided into the imaging element areas A1, connecting chips corresponding to the imaging element areas A1 and an external substrate, etc., formed with peripheral circuits, packaging, etc., for example. Consequently, the imaging element 100 is manufactured. In step S24, the imaging element 100 is manufactured using chips corresponding to the imaging element areas A1 including the photoelectric conversion layer 12 determined as being good, for example. On the other hand, chips corresponding to the imaging element areas A1 including the photoelectric conversion layer 12 determined as being not good are removed so that the imaging element 100 is not manufactured using such chips, for example.

The wafer 1 may be subjected to an inspection other than the inspection of the photoelectric conversion layer 12 in step S22. In this case, the result of the other inspection also may be collated with a determination criterion, and the subsequent manufacturing process may be continued for the imaging element areas A1 including the photoelectric conversion layer 12 determined as being good in the result of the other inspection as well.

By the method of manufacturing the imaging element 100 described above, the imaging element 100 can be manufactured with chips including the photoelectric conversion layer 12 determined as being not good removed, suppressing an increase in cost by avoiding manufacture of the imaging element 100 as a defective product up to the final process.

Modifications

The configuration of the wafer 1 and the imaging element 100 is not limited to that according to the example discussed above, and may have the configuration of a known stacked image sensor. A wafer 1*a* that includes a photoelectric conversion layer 12*a* formed from a compound semiconductor such as InGaAs and an imaging element manufactured from the wafer 1*a* will be described below. In the following description of a modification, the description of commonalities with the embodiment will be omitted or simplified.

Figure 12:
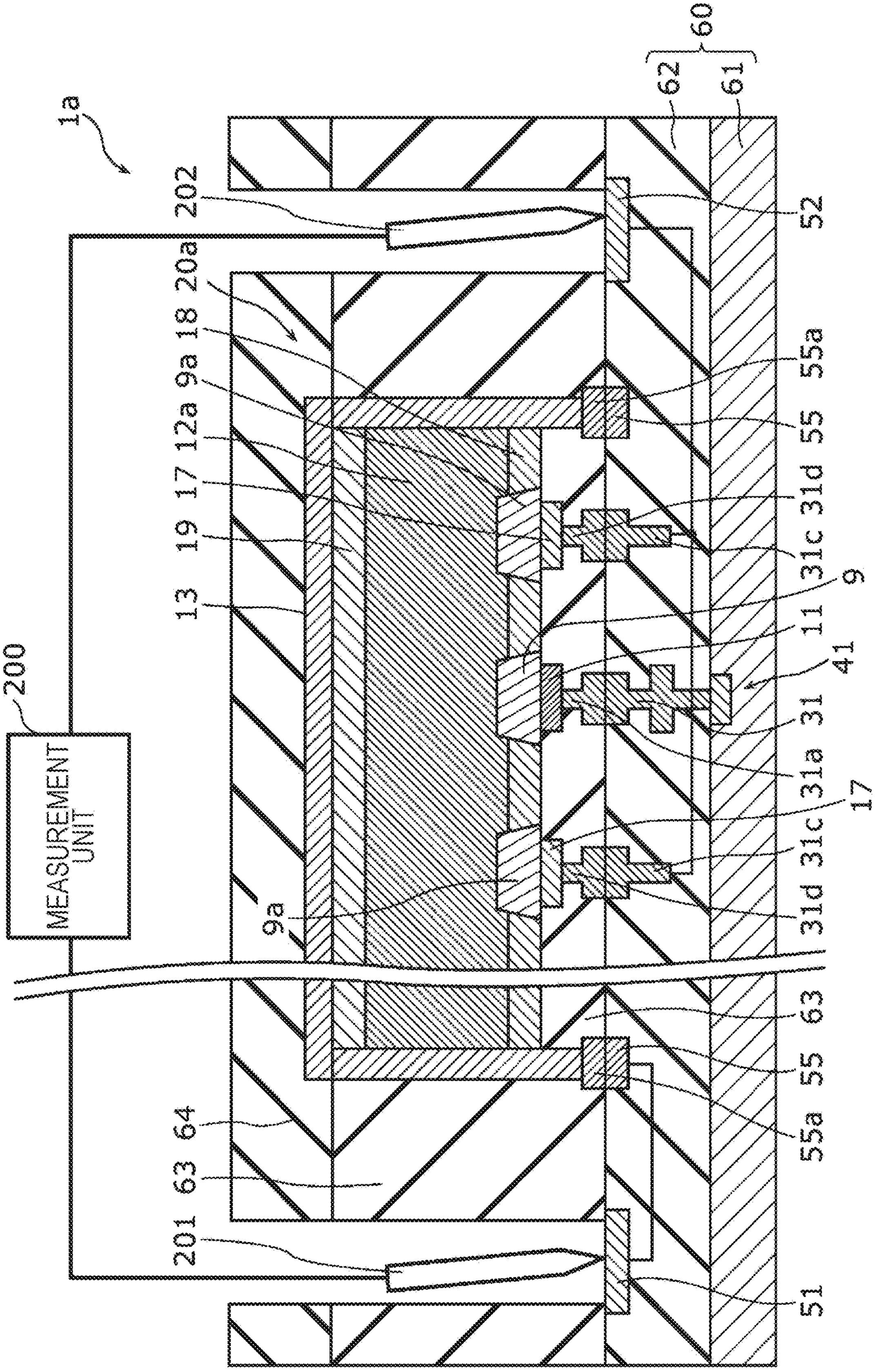
FIG. 12 is a sectional view illustrating a wafer according to a modification.
Figure 13:
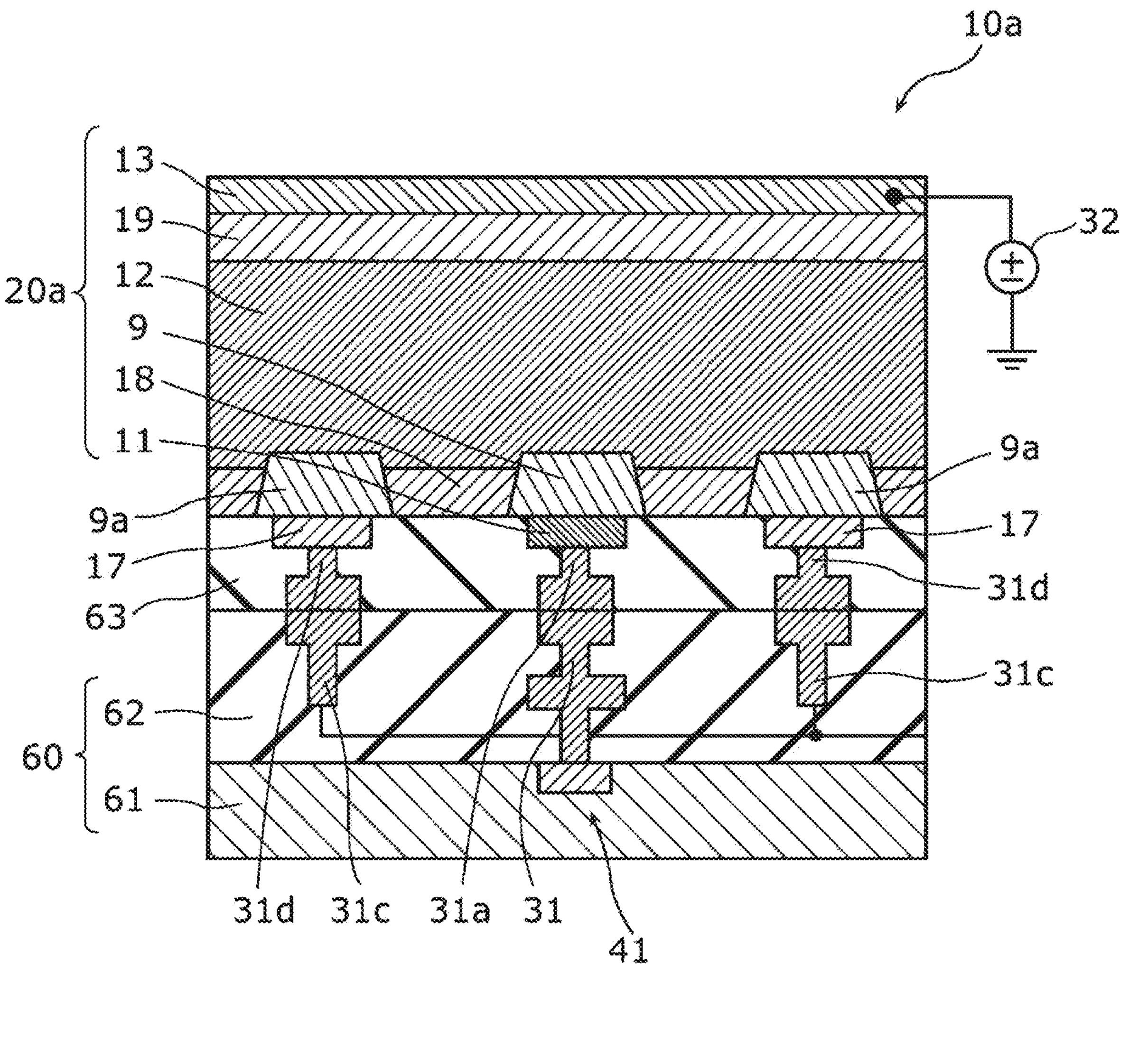
FIG. 13 is a sectional view illustrating an exemplary device structure of a pixel according to the modification.

FIG. 12 is a sectional view illustrating the wafer 1*a* according to the present modification. FIG. 13 is a sectional view illustrating an exemplary device structure of the pixel 10*a* according to the modification. In FIG. 12, a region corresponding to the imaging element area A1 illustrated in FIG. 2 is illustrated as a portion of the wafer 1*a*. In FIGS. 12 and 13, the detailed configuration in the CMOS circuit layer is not illustrated. The wafer 1*a* is different from the wafer 1 according to the embodiment mainly in including a photoelectric converter 20*a* in place of the photoelectric converter 20. An imaging element manufactured from the wafer 1*a* is configured to include pixels 10*a* illustrated in FIG. 13 in place of the pixels 10 of the imaging element 100 according to the embodiment.

The wafer 1*a* includes a CMOS circuit layer 60, an insulating layer 63, an insulating layer 64, a plurality of pixel electrodes 11, a shield electrode 17, an electrode pad 51, an electrode pad 52, an extraction electrode 55, a photoelectric conversion layer 12*a*, a counter electrode 13, a carrier transfer layer 18, a carrier transfer layer 19, an impurity diffusion region 9, and an impurity diffusion region 9*a*. In FIG. 12, only the pixel electrode 11 and the shield electrode 17 corresponding to a single pixel 10*a* of the pixel array are illustrated.

The insulating layer 63 and the insulating layer 64 are stacked in this order above the CMOS circuit layer 60. The insulating layer 63 and the interlayer insulating layer 62 of the CMOS circuit layer 60 are bonded through hybrid bonding including metal-metal bonding and dielectric-dielectric bonding.

The plurality of pixel electrodes 11, the photoelectric conversion layer 12*a*, the counter electrode 13, the carrier transfer layer 18, the carrier transfer layer 19, and the impurity diffusion region 9 constitute the photoelectric converter 20*a* above the CMOS circuit layer 60. A part of the insulating layer 63 is located between the photoelectric converter 20*a* and the CMOS circuit layer 60. The shield electrode 17 and the impurity diffusion region 9*a* are disposed between the photoelectric converter 20*a* and the CMOS circuit layer 60.

The photoelectric conversion layer 12*a* is constituted of a compound semiconductor such as n-type InGaAs, for example.

The impurity diffusion region 9 is disposed between the pixel electrode 11 and the photoelectric conversion layer 12*a*, and is in contact with the pixel electrode 11 and the photoelectric conversion layer 12*a*. The impurity diffusion region 9*a* is disposed between the shield electrode 17 and the photoelectric conversion layer 12*a*, and is in contact with the shield electrode 17 and the photoelectric conversion layer 12*a*. The impurity diffusion region 9 and the impurity diffusion region 9*a* are p-type impurity diffusion regions doped with p-type impurities such as Zn, and perform the function of collecting signal charges, for example. The signal charges generated by the photoelectric conversion layer 12*a* through photoelectric conversion, etc., are collected at the impurity diffusion region 9 and the impurity diffusion region 9*a* through diffusion, etc., due to a bias voltage between the counter electrode 13 and the pixel electrode 11 and the difference in concentration of the signal charges. The signal charges collected at the impurity diffusion region 9 are collected by the pixel electrode 11, and accumulated in the charge accumulator 41 via the plug 31*a* and the plug 31. The signal charges collected at the impurity diffusion region 9*a* are collected by the shield electrode 17.

The carrier transfer layer 18 transports holes as the signal charges generated by the photoelectric conversion layer 12*a* to the pixel electrode 11, and suppresses injection of electrons from the pixel electrode 11 into the photoelectric conversion layer 12*a*. The carrier transfer layer 19 transports electrons, as charges opposite to the signal charges generated by the photoelectric conversion layer 12*a*, to the counter electrode 13, and suppresses injection of holes from the counter electrode 13 into the photoelectric conversion layer 12*a*. The carrier transfer layer 18 and the carrier transfer layer 19 are constituted of n-type InP, for example.

The photoelectric conversion layer 12*a* constituted of n-type InGaAs is grown on another InP substrate to be formed, for example. The carrier transfer layer 18 and the carrier transfer layer 19 also function as a buffer layer for growing an n-type InGaAs layer with few deficiencies while adjusting the lattice constant when forming the photoelectric conversion layer 12*a*.

The plug 31*a* is provided at the lower end part in the insulating layer 63, and connects the pixel electrode 11 and the plug 31. The interface between the plug 31*a* and the plug 31 forms metal-metal bonding, for example. When the plug 31*a* and the plug 31 are constituted of copper (Cu), the interface between the plug 31*a* and the plug 31 forms Cu—Cu bonding.

A plug 31*d* is provided at the lower end part in the insulating layer 63, and connects the shield electrode 17 and a plug 31*c* provided in the interlayer insulating layer 62. The interface between the plug 31*d* and the plug 31*c* forms metal-metal bonding such as Cu—Cu bonding, for example. The shield electrode 17 is electrically connected to the electrode pad 52 via the plug 31*d* and the plug 31*c*.

The extraction electrode 55*a* is provided at the lower end part of the insulating layer 63, and is in contact with the counter electrode 13 and the extraction electrode 55. The interface between the extraction electrode 55*a* and the extraction electrode 55 constitutes metal-metal bonding such as Cu—Cu bonding, for example. The counter electrode 13 is electrically connected to the electrode pad 51 via the extraction electrode 55*a* and the extraction electrode 55.

The electrode pad 51 and the electrode pad 52 are formed on the CMOS circuit layer 60. The insulating layer 63 and the insulating layer 64 are provided with openings formed to expose the electrode pad 51 and the electrode pad 52. The electrode pad 51 may be formed on or in the insulating layer 63 or on or in the insulating layer 64 as long as the electrode pad 51 is electrically connected to the counter electrode 13. Similarly, the electrode pad 52 may be formed on or in the insulating layer 63 or on or in the insulating layer 64 as long as the electrode pad 52 is electrically connected to the shield electrode 17.

Also with the wafer 1*a*, as with the wafer 1 according to the embodiment, a current that flows between the electrode pad 51 and the electrode pad 52 can be measured by applying a voltage between the electrode pad 51 and the electrode pad 52 using the probe terminal 201 and the probe terminal 202. That is, it is possible to inspect the quality of the photoelectric conversion layer 12*a* of the wafer 1*a* by the inspection method described above with reference to FIG. 5. It is also possible to manufacture imaging elements from the wafer 1*a* by the manufacturing method described above with reference to FIG. 11.

Other Embodiments

While the wafer, the inspection method, the imaging element, and the method of manufacturing an imaging element according to the present disclosure have been described above on the basis of an embodiment, the present disclosure is not limited to such an embodiment.

For example, while a current that flows between the electrode pad 51 and the electrode pad 52 is measured by applying a voltage between the electrode pad 51 and the electrode pad 52 to the wafer 1 or 1*a* in the inspection method according to the embodiment, this is not limiting. The inspection method according to the present disclosure may be performed on devices as individual pieces obtained from the wafer 1 or 1*a*. Alternatively, the inspection method according to the present disclosure may be performed on an imaging element incorporated in a camera system or a sensor system. In this case, the imaging element is an example of a device. In this manner, the "device" according to the present disclosure includes not only a completed device but also an intermediate member in various states fabricated in the course of a manufacturing process.

While it is determined whether or not the photoelectric conversion layer 12 is good in the inspection method according to the embodiment, for example, this is not limiting. In the inspection method according to the present disclosure, it is not necessary to determine whether or not the photoelectric conversion layer 12 is good. In the inspection method according to the present disclosure, a current measured in step S12 may be recorded, for example.

The wafer and the imaging element according to the present disclosure may not include all the constituent elements described in relation to the embodiment, and may be composed of only constituent elements that perform objective operation.

The entire or specific aspect of the present disclosure may be implemented as an inspection device that performs the inspection method according to the embodiment, or may be implemented as a manufacturing device that performs the method of manufacturing an imaging element according to the embodiment.

Besides, the scope of the present disclosure also includes the embodiment and the example modified variously as contemplated by a person skilled in the art and other forms constructed by combining a part of constituent elements of the embodiment and the example, without departing from the spirit and scope of the present disclosure.

The inspection method and the method of manufacturing an imaging element according to the present disclosure can be used for imaging elements that are applicable to various camera systems and sensor systems for mobile use, medical use, monitoring use, in-vehicle use, measurement use including distance measurement, drone use, robot use, etc.

What is claimed is:

1. An inspection method comprising:

preparing a device that includes a plurality of pixel electrodes, a counter electrode disposed to face the plurality of pixel electrodes, a photoelectric conversion layer disposed between the plurality of pixel electrodes and the counter electrode, a test electrode disposed to face the counter electrode with the photoelectric conversion layer interposed between the counter electrode and the test electrode, a first electrode pad electrically connected to the counter electrode and exposed to an outside of the device, and a second electrode pad electrically connected to the test electrode and exposed to the outside of the device, the test electrode being disposed between two adjacent pixel electrodes of the plurality of pixel electrodes; and measuring a current that flows between the first electrode pad and the second electrode pad by applying a voltage between the first electrode pad and the second electrode pad.

2. The inspection method according to claim 1, wherein the device further includes a charge accumulator that accumulates charges obtained by the photoelectric conversion layer, the plurality of pixel electrodes are electrically connected to the charge accumulator, and the test electrode is not electrically connected to the charge accumulator.

3. The inspection method according to claim 1, wherein the test electrode has a same potential over a region in which the plurality of pixel electrodes are disposed.

4. The inspection method according to claim 3, wherein the photoelectric conversion layer converts light incident on the photoelectric conversion layer into charges, the plurality of pixel electrodes collect the charges, and the test electrode functions as a shield that suppresses movement of the charges between the plurality of pixel electrodes when the plurality of pixel electrodes collect the charges.

5. The inspection method according to claim 1, wherein the test electrode surrounds each of the plurality of pixel electrodes.

6. The inspection method according to claim 5, wherein the test electrode is disposed in a mesh shape in a region in which the plurality of pixel electrodes are disposed.

7. The inspection method according to claim 1, further comprising determining whether or not the photoelectric conversion layer is good on a basis of the current.

8. The inspection method according to claim 7, wherein the measuring of the current includes applying a predetermined voltage between the first electrode pad and the second electrode pad, and the determining of whether or not the photoelectric conversion layer is good includes determining that the photoelectric conversion layer is not good when a value of the current that flows between the first electrode pad and the second electrode pad when the predetermined voltage is applied is equal to or more than a predetermined current value, and determining that the photoelectric conversion layer is good when the current value is less than the predetermined current value.

9. The inspection method according to claim 7, wherein the measuring of the current includes measuring current-voltage characteristics between the first electrode pad and the second electrode pad while sweeping the voltage applied between the first electrode pad and the second electrode pad, and the determining of whether or not the photoelectric conversion layer is good includes determining whether or not the photoelectric conversion layer is good on a basis of the current-voltage characteristics.

10. The inspection method according to claim 9, wherein the determining of whether or not the photoelectric conversion layer is good includes determining whether or not the photoelectric conversion layer is good on a basis of a slope of the current-voltage characteristics.

11. A method of manufacturing an imaging element, comprising:

fabricating a device that includes a plurality of pixel electrodes, a counter electrode disposed to face the plurality of pixel electrodes, a photoelectric conversion layer disposed between the plurality of pixel electrodes and the counter electrode, a test electrode disposed to face the counter electrode with the photoelectric conversion layer interposed between the counter electrode and the test electrode, a first electrode pad electrically connected to the counter electrode and exposed to an outside of the device, and a second electrode pad electrically connected to the test electrode and exposed to the outside of the device, the test electrode being disposed between two adjacent pixel electrodes of the plurality of pixel electrodes;

performing an inspection on the device by the inspection method according to claim 7;

continuing forming an imaging element on the device when the photoelectric conversion layer is determined to be good in the inspection; and discontinuing forming the imaging element when the photoelectric conversion layer is not determined to be good in the inspection.

12. An imaging apparatus comprising:

a plurality of pixel electrodes;

a counter electrode disposed to face the plurality of pixel electrodes;

a photoelectric conversion layer disposed between the plurality of pixel electrodes and the counter electrode;

a test electrode disposed to face the counter electrode with the photoelectric conversion layer interposed between the counter electrode and the test electrode, the test electrode being disposed between two adjacent pixel electrodes of the plurality of pixel electrodes;

a first electrode pad electrically connected to the counter electrode; and a second electrode pad electrically connected to the test electrode.

* * * * *